(12) United States Patent
Iri et al.

(10) Patent No.: US 7,569,118 B2
(45) Date of Patent: Aug. 4, 2009

(54) METHOD FOR DICING WAFER AND PROCESS FOR MANUFACTURING LIQUID-DISCHARGING HEAD USING THE DICING METHOD

(75) Inventors: Junichiro Iri, Kawasaki (JP); Toshio Kashino, Fujisawa (JP); Genji Inada, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 525 days.

(21) Appl. No.: 11/113,665

(22) Filed: Apr. 25, 2005

(65) Prior Publication Data

US 2005/0241754 A1    Nov. 3, 2005

(30) Foreign Application Priority Data

| Apr. 28, 2004 | (JP) | ............................. 2004-132415 |
| Apr. 30, 2004 | (JP) | ............................. 2004-135193 |
| Dec. 7, 2004 | (JP) | ............................. 2004-353693 |
| Dec. 7, 2004 | (JP) | ............................. 2004-353694 |
| Apr. 15, 2005 | (JP) | ............................. 2005-117693 |

(51) Int. Cl.
*B32B 38/00* (2006.01)
*B29C 65/14* (2006.01)
*B32B 38/10* (2006.01)

(52) U.S. Cl. .................... 156/275.1; 156/247; 156/268; 156/275.5; 156/344; 438/464; 438/976

(58) Field of Classification Search ................. 156/247, 156/268, 272.2, 344, 584, 275.1, 275.5; 438/118, 438/459, 458, 464, 976
See application file for complete search history.

(56) References Cited

U.S. PATENT DOCUMENTS

| 5,362,681 | A  | * | 11/1994 | Roberts et al. .............. 438/464 |
| 6,171,163 | B1 |   | 1/2001 | Seko |
| 6,245,593 | B1 | * | 6/2001 | Yoshihara et al. ........... 438/106 |
| 6,305,080 | B1 |   | 10/2001 | Komuro |
| 6,555,417 | B2 | * | 4/2003 | Spooner et al. ............. 438/113 |
| 6,893,574 | B2 | * | 5/2005 | Felton et al. .................... 216/2 |
| 2003/0211707 | A1 | * | 11/2003 | Brouillette et al. .......... 438/459 |
| 2005/0098877 | A1 | * | 5/2005 | Adachi et al. ............... 257/706 |

FOREIGN PATENT DOCUMENTS

| JP | 62-79649 A | 4/1987 |
| JP | 2000-223446 | 8/2000 |
| JP | 2002-043253 | 2/2002 |

* cited by examiner

*Primary Examiner*—Mark A. Osele
*Assistant Examiner*—Christopher C Caillouet
(74) *Attorney, Agent, or Firm*—Canon USA Inc IP Div

(57) ABSTRACT

A method for dicing a wafer having a first face in which opening are arranged along dicing streets. The method includes a step of affixing a dicing tape to the first face such that the dicing tape lies over the openings and adhesive regions of the dicing tape are exposed in the openings and a step of treating the dicing tape to reduce the adhesive strength of the adhesive regions.

5 Claims, 21 Drawing Sheets

FIG. 5A  FIG. 5B  FIG. 5C
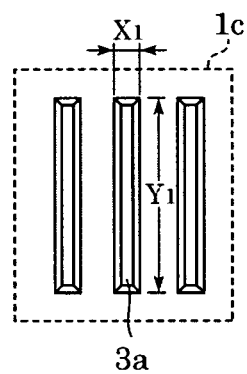
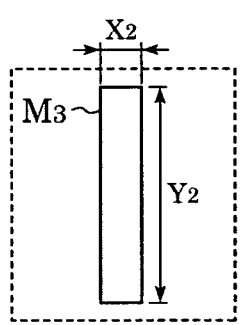
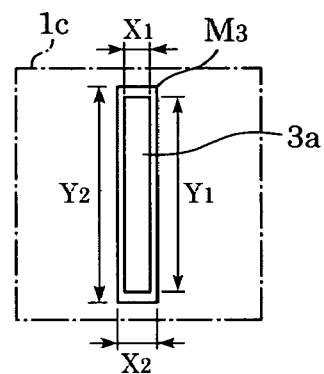
FIG. 5D  FIG. 5E
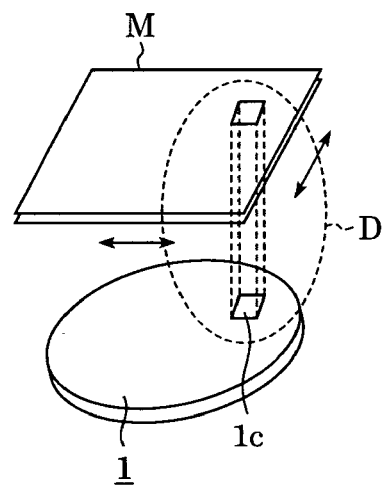
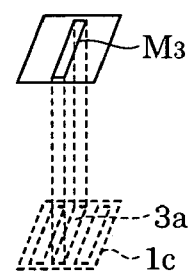

US 7,569,118 B2

METHOD FOR DICING WAFER AND PROCESS FOR MANUFACTURING LIQUID-DISCHARGING HEAD USING THE DICING METHOD

BACKGROUND OF THE INVENTION

1. Field of the Invention

The present invention relates to methods for dicing wafers and particularly relates to methods for dicing wafers having semiconductor element sections arranged thereon to separate the semiconductor element sections. The present invention more particularly relates to a method for dicing a wafer having openings arranged in a face thereof and a dicing tape affixed to the wafer face to manufacture element substrates for liquid-discharging heads for discharging liquid from orifices arranged on the front faces of the substrates, the liquid being supplied from supply ports placed on the rear faces of the substrates. The present invention also relates to a method for manufacturing a liquid-discharging head using the dicing method.

2. Description of the Related Art

In general, various semiconductor elements are manufactured by the following procedure: a plurality of semiconductor circuit sections are simultaneously formed on a silicon wafer or other wafer types, the circuit sections are separated from each other in a dicing step, and then processed into sealed packages.

With reference to FIG. 26A, in such a dicing step, a wafer 101 having a plurality of element sections 101a arranged on the front face thereof is mounted on a dicing tape 110 affixed to a dicing frame K such that the rear face of the wafer 101 is in contact with the dicing tape 110. The dicing tape 110 includes a backing 111 and an adhesive 112, placed on the backing 111, for retaining the wafer 101.

The dicing tape 110 is a sheet including an adhesive and a backing coated therewith. The adhesive 112 contains an ultraviolet-curable compound such that the element sections 101a separated can be readily picked up individually by reducing the adhesive strength of the adhesive in a step subsequent to the dicing step.

The resulting dicing frame K is fixed on a chuck table of a dicing machine and the alignment of the wafer 101 is performed with an alignment device. As shown in FIGS. 26A and 26B, the wafer 101 is cut along dicing streets 101b arranged on the wafer 101 using a dicing blade B.

The diced wafer 101 is removed from the dicing machine and the rear face of the wafer 101 is irradiated with ultraviolet light, whereby the adhesive 112 is cured and thereby reduced in adhesive strength. This allows the separated element sections 101a to be readily peeled off from the dicing tape 110 and then separately picked up.

Since the element sections 101a of the wafer 101 are used as element substrates for liquid-discharging heads, nozzle layers 102 having orifices 105 for discharging liquid are arranged on the front face of the wafer 101 and ink supply ports 103 for supplying ink to the orifices 105 are each arranged under the corresponding nozzle layers 102. Each ink supply port 103 communicates with the corresponding orifice 105 with channels 104 placed therebetween, the channels 104 being arranged in the nozzle layers 102 (see Japanese Patent Laid-Open No. 11-179926, corresponding to U.S. Pat. No. 6,305,080).

Japanese Patent Laid-Open No. 62-79649 discloses that in order to enhance the efficiency of a dicing step by preventing problems such as insulation faults caused by the adhesion of an adhesive of a dicing tape to a dicing blade from occurring, the adhesive is partly cured along dicing streets before dicing is conducted.

Japanese Patent Laid-Open No. 11-111162 discloses that when a protective tape including an adhesive is affixed to the front face of a wafer and the wafer is then diced, portions of the adhesive that correspond to electrode sections (emitter regions) arranged on the wafer are cured in a step conducted prior to the step of affixing the protective tape to the wafer such that the adhesive is prevented from adhering to the electrode sections. However, this technique has a problem in that alignment must be performed before the protective tape is affixed to the wafer, increasing the number of manufacturing steps.

With reference to FIG. 27, since the wafer 101 has the element sections 101a having the ink supply ports 103 arranged under the element sections 101a, the adhesive 112 of the dicing tape 110 affixed to the rear face of the wafer 101 is exposed in the ink supply ports 103.

Therefore, when the wafer 101 is diced with the dicing blade B, the adhesive 112 is partly broken due to microvibration indicated by Arrow S during dicing as shown in FIG. 28B to create adhesive particles 112a, because the adhesive 112 contains the ultraviolet-curable compound and is therefore soft. The adhesive 112 is particularly soft when it contains an ultraviolet-curable acrylic compound. The adhesive particles 112a adhere to the edges of the ink supply ports 103 that are openings arranged under the element sections 101a as shown in FIG. 28B. Furthermore, cooling water W enters the orifices 105 of the nozzle layers 102 during dicing to make contact with the adhesive 112 partly exposed in the ink supply ports 103.

As shown in FIG. 29A, the cooling water W in the orifices 105 is then removed from the orifices 105 by air blowing. In this operation, as shown in FIG. 29B, pieces 112a are removed from the adhesive 112 partly exposed in the ink supply ports 103 because the adhesive 112 receives shock from air and the cooling water W. Although most of the removed adhesive particles 112a are discharged out of the nozzle layers 102 together with the cooling water W, a small amount of the adhesive particles 112a cannot be removed and therefore remain around the orifices 105.

It is known that a low-molecular weight component is eluted from the adhesive 112 into pure water although the amount of the eluted component is small. The eluted component as well as the adhesive particles 112a remains around the orifices 105 in some cases.

After the dicing tape 110 affixed to the rear face of the wafer 101 is irradiated with ultraviolet light and the adhesive strength of the adhesive 112 is thereby reduced, the element sections 101a separated from each other by dicing are removed from the dicing tape 110 and then picked up. The adhesive particles 112a present around the orifices 105 remain as they are after pickup is performed. Furthermore, the adhesive particles 112a probably remain as they are after the element sections 101a used as elements are subjected to a step subsequent to a mounting step. This causes the following problems: the adhesive particles 112a remaining in the element sections 101a cause a failure in discharging droplets from liquid-discharging heads and the adhesive particles 112a are dispersed in ink to block the orifices 105.

SUMMARY OF THE INVENTION

The present invention is directed to a method for dicing a wafer having openings arranged in a face thereof and a process for manufacturing a liquid-discharging head using the dicing method. The dicing method prevents adhesive cutting dust from remaining in the openings when the wafer is diced.

In other words, the dicing method prevents adhesive particles and/or a low-molecular weight component, created from an adhesive included in a dicing tape in a step of dicing the wafer, from remaining in elements arranged on the wafer to prevent problems from occurring and is useful in manufacturing a liquid-discharging head in which no orifice plugging nor a failure in discharging occurs and which has high quality and reliability.

In one aspect of the present invention, a method for dicing a wafer having a first face, dicing streets, and opening arranged along the dicing streets, is provided. This dicing method includes a step of affixing a dicing tape having adhesive regions to the first face such that the dicing tape lies over the openings and the adhesive regions are exposed in the openings, and a step of treating the dicing tape to reduce an adhesive strength of the adhesive regions.

Further features and advantages of the present invention will become apparent from the following description of exemplary embodiments with reference to the attached drawings.

BRIEF DESCRIPTION OF THE DRAWINGS

FIG. 5 is an illustration showing the wafer and a light-shielding mask aligned therewith; FIGS. 5A to 5C are schematic views showing the size of light-transmissive sections arranged in the light-shielding mask; FIG. 5D is a schematic view showing a operation of aligning the wafer with the light-shielding mask; FIG. 5E is a partially enlarged view of circle D shown in FIG. 5D.

FIG. 28 is an illustration showing a former part of a dicing step included in a known dicing method.

FIG. 29 is an illustration showing a latter part of the dicing step of the known dicing method.

DESCRIPTION OF THE EMBODIMENTS

Embodiments of the present invention will now be described with reference to the accompanying drawings.

First Embodiment

Figure 1:
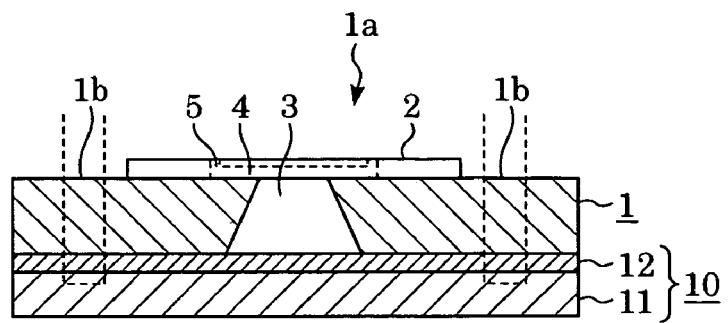
FIG. 1 is a fragmentary sectional view showing a part of a wafer having a dicing tape affixed thereto.

A first embodiment of the present invention provides a dicing method described below. With reference to FIG. 1, a wafer 1 to be diced has element sections 1a, which each include corresponding semiconductor circuit regions, nozzle layers 2 having orifices 5 and channels 4, and ink supply ports (liquid supply ports) 3. The semiconductor circuit regions and the nozzle layers 2 are arranged on the front face of the wafer 1 and form discharging devices. The liquid supply ports 3 extend from the rear face of the wafer 1 and communicate with the orifices 5 via the channels 4 placed therebetween. These components form element substrates for liquid-discharging heads. A dicing tape 10 including a bucking 11 and an adhesive 12 placed thereon is affixed to the rear face of the wafer 1. The element sections 1a are separated from each other by dicing the wafer 1 along dicing streets 1b extending along cutting lines. As shown in FIG. 2, before dicing is performed, ultraviolet light P is applied to the rear face of the wafer 1 using a light-shielding mask M having perforations (light-transmissive sections) Mo through which light passes and which correspond to the liquid supply ports 3, whereby only regions of the adhesive 12 that correspond to the perforations Mo are reduced in adhesive strength. This leads to the formation of adhesive layers 12a having low adhesive strength. Therefore, as shown in FIGS. 3A-B, adhesive particles can be prevented from being created in the liquid supply ports 3 when the adhesive 12 receives shock due to air blowing and/or cooling water W. Even if such adhesive particles and/or low-molecular weight components are created, they have low adhesive strength and therefore hardly adhere to regions including the orifices 5. Hence, the adhesive particles and/or the low-molecular weight components hardly remain on the element substrates separated by dicing as compared to those prepared by the known method. Thus, the following head can be manufactured: a liquid-discharging head in which no orifice plugging nor a failure in discharging due to adhesive particles occurs and which has high quality and reliability.

Figure 2A:
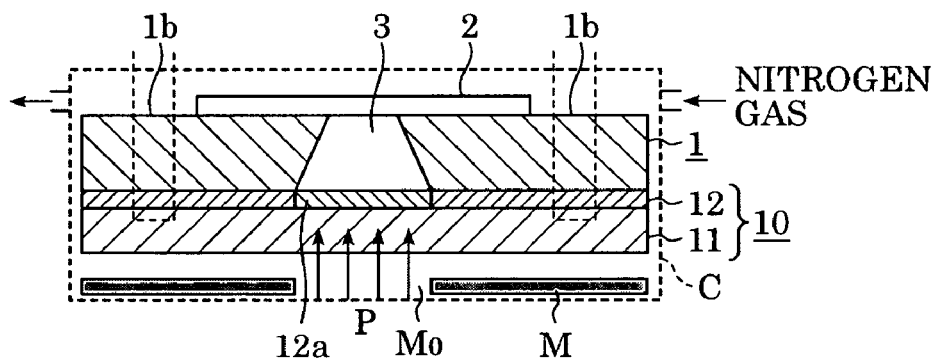
FIGS. 2A and 2B are illustrations showing a former part of a dicing step according to a first embodiment of the present invention.
Figure 2B:
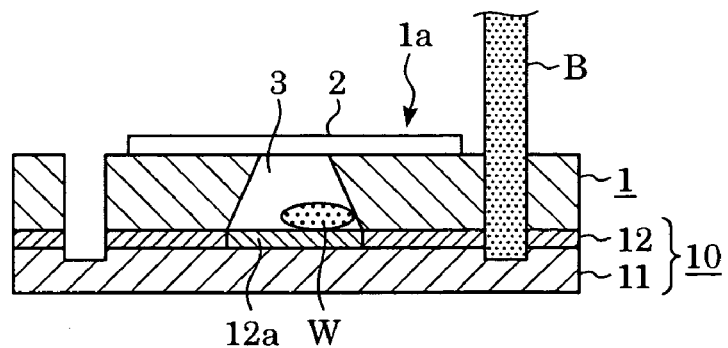
Figure 3A:
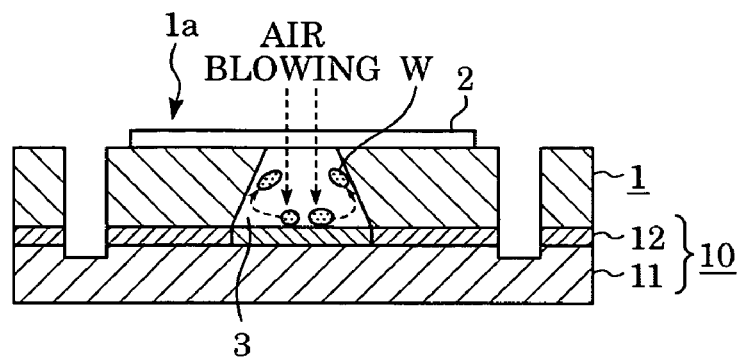
FIGS. 3A and 3B are illustrations showing a latter part of the dicing step according to the first embodiment.
Figure 3B:
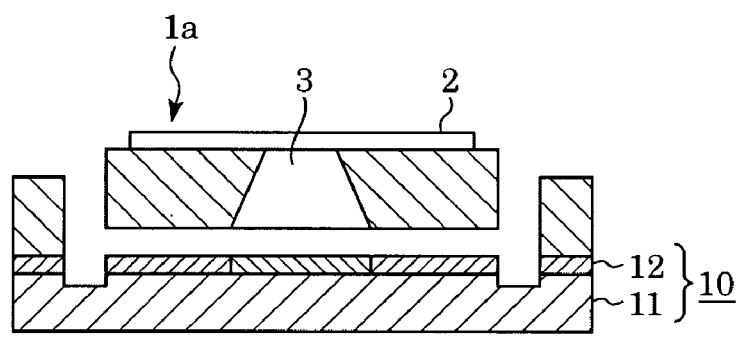

The wafer 1 is fixed to the dicing tape 10 as shown in FIG. 1, the adhesive 12 is partly irradiated with ultraviolet light using the light-shielding mask M as shown in FIG. 2A, and the wafer 1 is then cut along the dicing streets 1b with the dicing blade B as shown in FIG. 2B. The resulting wafer 1 is dried by air blowing as shown in FIG. 3A and the element sections 1a are removed from the dicing tape 10 and then picked up.

In the dicing tape 10, the bucking 11 is a kind of film and the adhesive 12 contains a radically polymerizable acrylic compound that is photocurable and particularly ultraviolet-curable. The dicing tape 10 is bonded to the wafer 1 by the adhesion of the adhesive 12.

The wafer 1 has a thickness of about 600 µm, the adhesive 12 has a thickness of about 10 µm, and the bucking 11 has a thickness of 80 µm.

In a step of aligning the light-shielding mask M with the dicing streets 1b extending along the cutting lines, at least two of the element sections 1a are used as alignment chips 1c, of which the liquid supply ports 3 are referred to as apertures 3a.

Figure 4:
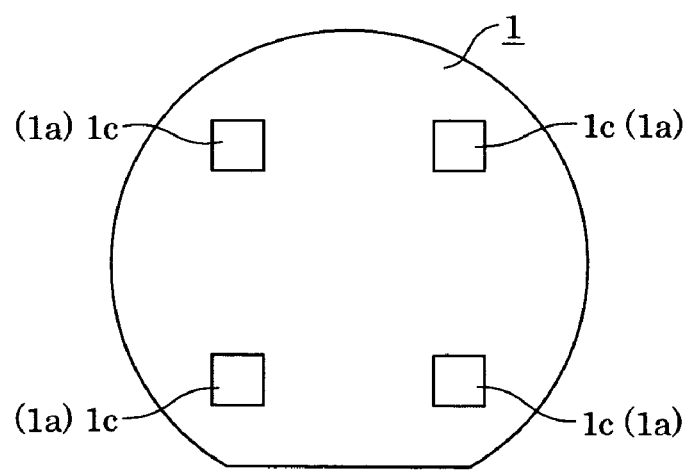
FIG. 4 is an illustration showing chips used for the alignment of the wafer.

FIG. 4 shows the positions of the alignment chips 1c used in this embodiment. One of the apertures 3a is aligned with an alignment hole M3 placed in the light-shielding mask M (shown in FIG. 2A), whereby the position of the light-shielding mask M is fixed.

In this embodiment, four of the element sections 1a are used as the alignment chips 1c. The number of the alignment chips 1c is not limited to four. At least two of the alignment chips 1c may be arranged close to the edge of the wafer 1.

In consideration of the width of the dicing streets 1b and the accuracy in forming the apertures 3a, the length and width of the apertures 3a and the those of the alignment hole M3 are set so as to satisfy the following equations:

$$X2=X1+0.1$$

$$Y2=Y1+0.1$$

wherein X1 represents the width of the apertures 3a, Y1 represents the length of the apertures 3a, X2 represents the width of the alignment hole M3, and Y2 represents the length of the alignment hole M3 as shown in FIGS. 5A to 5C, those sizes being expressed in µm.

In order to perform alignment, the wafer 1 is turned upside down and the light-shielding mask M is precisely moved above the wafer 1 in one of the directions indicated by the arrows shown in FIGS. 5D and 5E such that the alignment hole M3 is aligned with one of the apertures 3a using the alignment chips 1c as standard points. When each alignment chip 1c has the three apertures 3a as shown in FIG. 5A, the misalignment of the apertures 3a placed on both sides of the center one can be prevented by aligning the center opening 3a with the alignment hole M3.

Since the alignment of the light-shielding mask M is performed using the apertures 3a arranged in the rear face of the wafer 1 as described above, the misalignment between the dicing streets 1b and regions irradiated with ultraviolet light P can be controlled within the range of about ±30 µm.

In the step of applying ultraviolet light P to the rear face of the wafer 1 using the light-shielding mask M to partly reduce the adhesive strength of the adhesive 12 to form the adhesive layers 12a, in order to prevent radical species from being deactivated due to oxygen in air, it is necessary to reduce the content of oxygen in the atmosphere of the liquid supply ports 3, in which the adhesive 12 is partly exposed, by nitrogen purge or the like. The wafer 1 is housed in a chamber C as shown in FIG. 2A and the oxygen in the atmosphere of the chamber C is reduced to lower than 2% by introducing nitrogen gas into the chamber C. Oxygen in the liquid supply ports 3 is replaced with nitrogen that enters the liquid supply ports 3 through the orifices 5 and then diffuses in the liquid supply ports 3 while the chamber C is allowed to stand for a predetermined time. This leads to a decrease in the content of oxygen in the atmosphere of the liquid supply ports 3 to prevent the radical polymerization activity of the adhesive 12 partly exposed in the liquid supply ports 3 from being reduced.

The intensity of ultraviolet light P used is 600 mJ/cm$^2$ (determined at a wavelength of 365 nm). The adhesive layers 12a corresponding to the irradiated regions of the adhesive 12 are semi-cured (or reduced in adhesive strength) or cured (or substantially lost in adhesive strength). As shown in FIG. 2B, the resulting wafer 1 is diced with the dicing blade B, whereby the element sections 1a are separated from each other.

Dicing conditions are as follows: a blade thickness of 50 µm, a feed rate of 30 mm/s, and a blade rotation speed of 50,000 rpm. The element sections 1a separated from each other as shown in FIG. 3A are picked up as shown in FIG. 3B.

Figure 6:
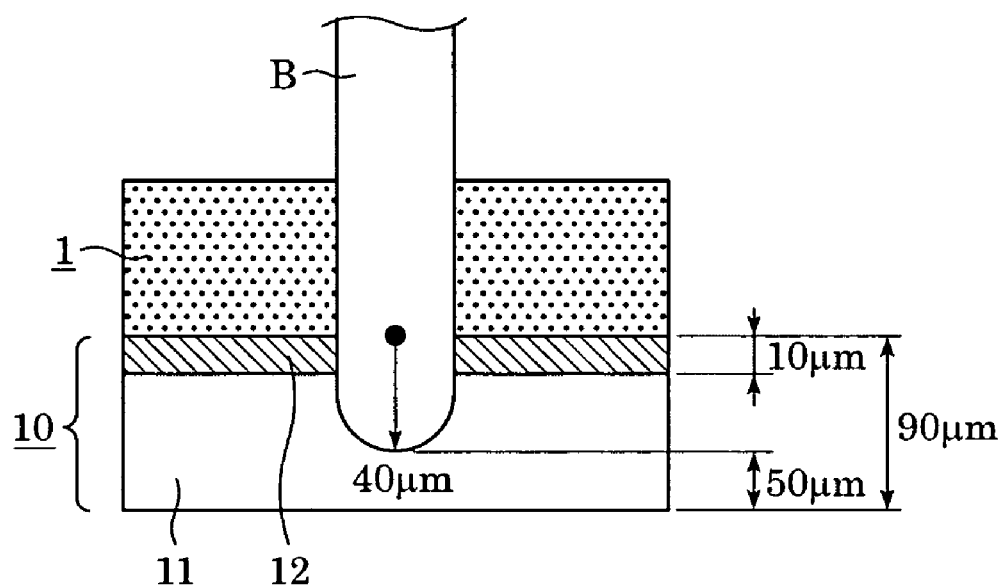
FIG. 6 is an illustration showing the depth of a portion that a dicing blade penetrates.

As shown in FIG. 6, the edge of the dicing blade B penetrates the dicing tape 10 to a depth of about 40 µm and an uncut portion with a thickness of about 50 µm remains in the dicing tape 10. The dicing blade B penetrates the bucking 11 placed under the adhesive 12 to a depth of about 30 µm. Since the tip of the edge of the dicing blade B moves across the wafer 1, the wafer 1 has flat cut faces.

Although micro-vibration occurs at the element sections 1a during dicing, the adhesive particles are hardly created in contrast to the known dicing method because the adhesive 12 has been partly cured as described above. Cooling water W enters the liquid supply ports 3 through the orifices 5 extending from the front face of the wafer 1 during dicing. Furthermore, cleaning water enters the liquid supply ports 3 in a cleaning step usually performed; hence, the amount of water in the liquid supply ports 3 is large. Therefore, after dicing is performed, air is blown onto the nozzle layers 2 having the orifices 5 as shown in FIG. 3A, whereby water in the liquid supply ports 3 is removed.

Although the adhesive layers 12a exposed in the liquid supply ports 3 receives shock due to air and/or water in the liquid supply ports 3, the adhesive layers 12a are rarely peeled off because they are at least semi-cured. Even if the adhesive layers 12a are peeled off, they hardly re-adhere to the periphery of the liquid supply ports 3 because their adhesive strength is slight. Furthermore, since the adhesive layers 12a have been subjected to curing, a low-molecular weight component of the adhesive 12 is prevented from being eluted. In the picked-up element sections 1a separated by dicing, the adhesive particles and the like therefore hardly remain in or around the liquid supply ports 3 and the orifices 5.

Although the portions of the adhesive 12 that are exposed in the liquid supply ports 3 are reduced in adhesive strength as described above, regions of the adhesive 12 that are located directly below the dicing streets 1b may be cured (or lost in adhesive strength).

Figure 7:
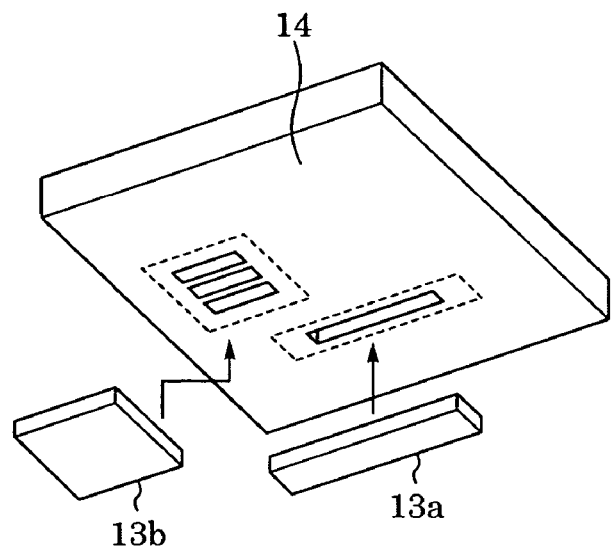
FIG. 7 is an illustration showing a principal part of a liquid-discharging head.
Figure 8:
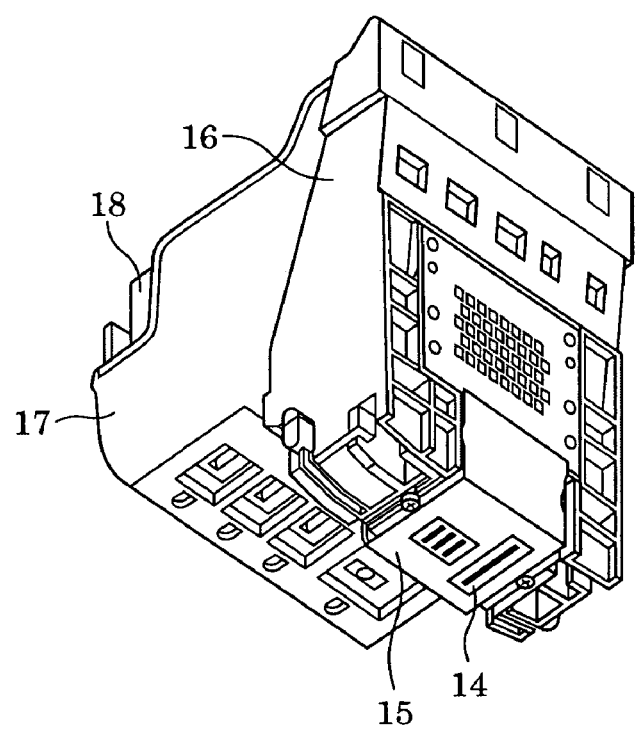
FIG. 8 is a perspective view showing the whole of the liquid-discharging head.

FIGS. 7 and 8 separately show a principal portion of a liquid-discharging recorder including element substrates 13a and 13b, prepared by the dicing method of this embodiment, for liquid-discharging heads. The element substrates 13a and 13b obtained by dicing the wafer 1 are fixed to a mounting substrate 14 in such a manner that the rear faces thereof are in contact with the mounting substrate 14. The resulting element substrates 13a and 13b are electrically connected to a flexible wiring member 15, whereby a liquid-discharging head is prepared. Furthermore, an ink supply unit 16 and a tank holder 17 are attached to the liquid-discharging head, whereby a liquid-discharging head cartridge is prepared. After an ink tank 18 is provided in the tank holder 17, ink can be discharged from the liquid-discharging head.

Since the liquid-discharging recorder includes the liquid-discharging head including element substrates 13a and 13b obtained by the dicing method of this embodiment, droplets are not discharged in random directions but can be constantly discharged from the liquid-discharging head. Furthermore, since orifice plugging and a failure in discharging do not occur during the use of the liquid-discharging recorder for a long time, the liquid-discharging recorder is high in reliability.

Another type of dicing tape including a thermosetting adhesive may be used instead of the dicing tape 10 including the ultraviolet-curable adhesive 12. In this case, regions of the thermosetting adhesive from the liquid supply ports 3 can be reduced in adhesive strength by selectively applying heat to the exposed regions; hence, the same advantages as those described above can be obtained. However, since heat is used, it is more difficult to define the regions of which the adhesive strength is reduced as compared to the use of the ultraviolet-curable adhesive 12. The ultraviolet-curable adhesive 12 is particularly superior to the thermosetting adhesive in processing the fine element sections 1a used in this embodiment.

In this embodiment, the element sections 1a each have one liquid supply port 3. Each element section 1a may have a plurality of the liquid supply ports 3 arranged alternately or in parallel.

Second Embodiment

A second embodiment of the present invention will now be described with reference to FIGS. 9 to 13.

In the first embodiment, the wafer 1 is loosely fixed during dicing after the adhesive 12 is partly cured prior to dicing. Therefore, minimum regions of the adhesive 12 are selectively cured. However, the width of the adhesive layers 12a that are formed by curing regions of the adhesive 12 as described above before dicing is performed increases with an increase in the dose (irradiation dose) of ultraviolet light; hence, the cured regions are apt to have a width greater than a required value. This phenomenon is referred to as an increase in pattern size and caused by the scattering of a portion of ultraviolet light incident on the backing 11. In general, in order to prevent an adhesive of a dicing tape from remaining on separated elements during the pick up of the elements, the adhesive has a thickness less than that of a backing. Therefore, ultraviolet light is mostly scattered by the irregular surface of the baking when it is incident on the backing surface or scattered while it is passing through the backing and the interface between the backing and the adhesive, the interface having irregularities.

The amount of scattered light increases with an increase in the width of perforations of a light-shielding mask although the irradiation dose is constant. This leads to an increase in the magnitude of the increase in pattern size. A part of ultraviolet light applied to the adhesive of the dicing tape is absorbed by the adhesive, which is partly cured. Another part thereof passes through the adhesive to reach liquid supply ports and is then reflected by the walls of the liquid supply ports and the adhesive is further irradiated with the reflected light. This phenomenon greatly depends on the fact that the spaces in the liquid supply ports have a three-dimensional structure in which incident light is reflected or scattered. This phenomenon is particularly serious when the spaces have such a reflector shape that the spaces are enlarged from the front face of the wafer toward the rear face thereof.

Figure 9A:
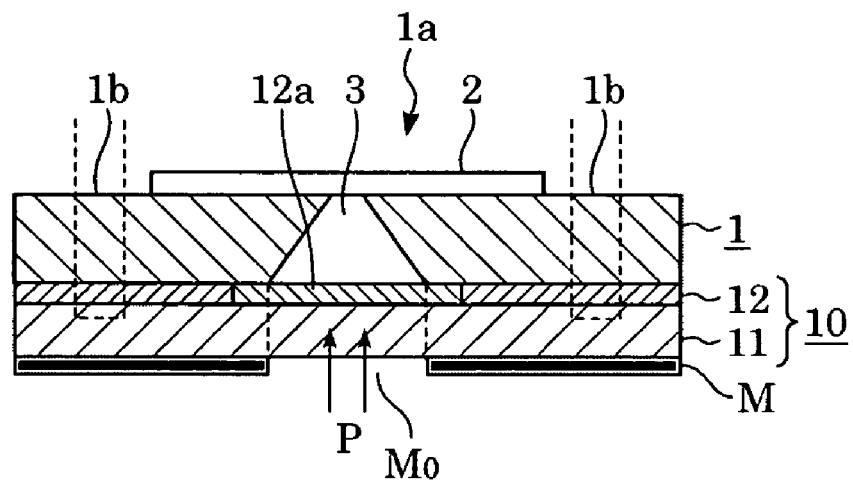
FIGS. 9A and 9B are illustrations showing an increase in pattern size occurring in a partly cured region.

With reference to FIG. 9A, the area of the adhesive layers 12a formed by partly curing the adhesive 12 is greater than that of the perforations Mo of the light-shielding mask M because of the effects of the scattered or reflected light described above. This prevents the wafer 1 from being securely fixed on the dicing tape 10 with adhesive 12 to cause problems such as chipping (the damage of the wafer 1) during dicing.

Figure 9B:
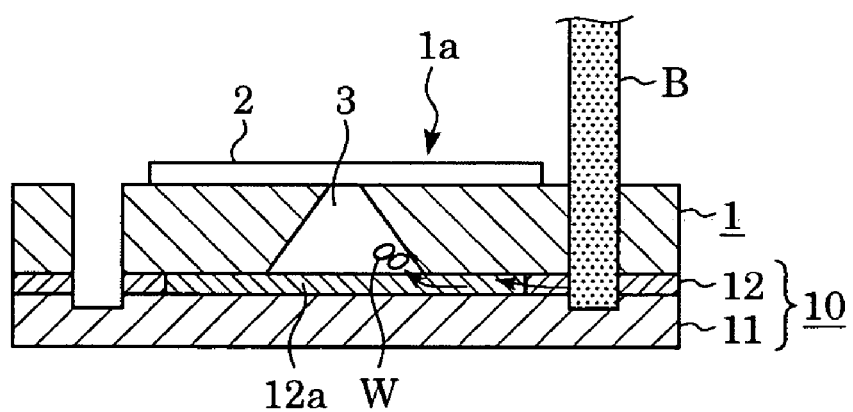

With reference to FIG. 9B, the cured regions extend close to the dicing streets 1b. In this case, paths are formed between the dicing streets 1b and the liquid supply ports 3 because of vibration during dicing and dicing particles H enter the liquid supply ports 3 at high speed through the paths and adhere to the walls of the orifices 5. This causes failures. Furthermore, if the cured regions extend over the rear faces of the element sections 1a, chipping occurs during dicing.

In order to prevent these problems, the area of the cured regions of the adhesive 12 may be controlled by adjusting the irradiation dose of ultraviolet light. However, in consideration of differences in curing property between dicing tapes manufactured in different batches, it is necessary to precisely control the irradiation dose when the adhesive 12 is partly cured, because the cured regions are peeled off from the wafer 1 after the adhesive 12 is partly cured by the irradiation of ultraviolet light.

Figure 10:
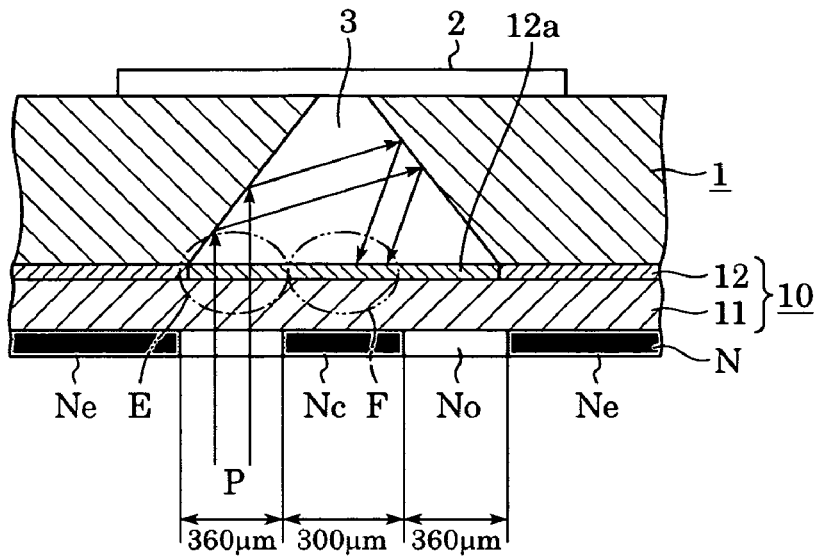
FIG. 10 is an enlarged fragmentary sectional view showing a dicing method according to a second embodiment of the present invention.
Figure 12:
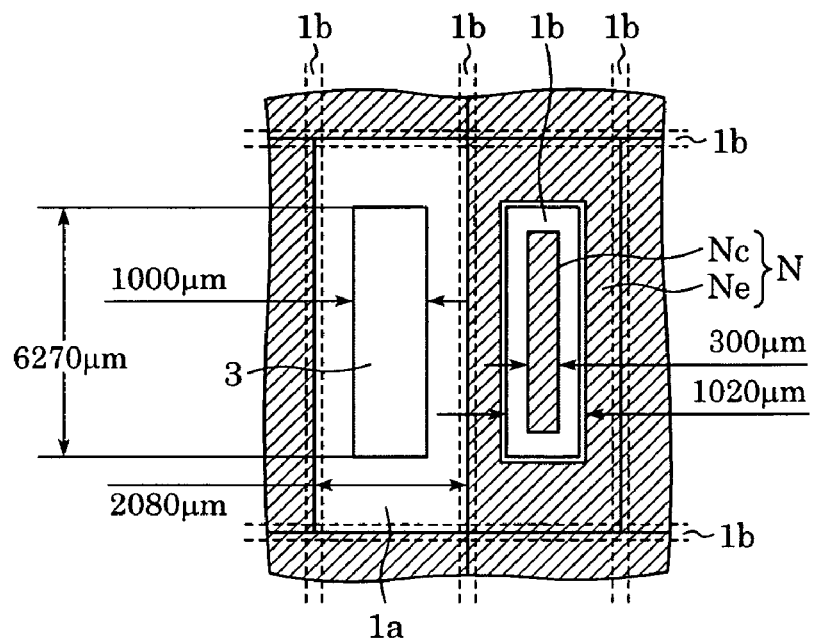
FIG. 12 is an illustration showing the size of a light-shielding mask according to the second embodiment.

A second embodiment of the present invention provides a dicing method described below. In this embodiment, in order to precisely control cured regions of an adhesive 12 without depending on the irradiation dose, a light-shielding mask N shown in FIGS. 10 and 12 is used. The light-shielding mask N includes first mask sections Ne each having corresponding perforations (light-transmissive sub-sections) No though which light passes and which have substantially the same size as that of the cured regions of the adhesive 12 and further includes second mask sections Nc, each placed at corresponding center portions of the perforations No, for blocking light.

A silicon wafer 1 having a (111) surface is prepared. The (111) surface of the wafer 1 is anisotropically etched, whereby liquid supply ports 3 are formed. The liquid supply ports 3 are enlarged from the front face of the wafer 1 toward the rear face thereof. Walls of the liquid supply ports 3 form an angle of about 55 degrees with the rear face of the wafer 1. A dicing tape 10 affixed to the rear face of the wafer 1 includes a bucking 11 which is a kind of film and a radically polymerizable acrylic adhesive 12 which contains a ultraviolet-curable material, which has a predetermined adhesive strength, and which is placed on the bucking 11. The wafer 1 has a thickness of about 600 μm, the adhesive 12 has a thickness of about 10 μm, and the bucking 11 has a thickness of about 80

μm. The adhesive strength of the adhesive 12 used in this embodiment is decreased to about one fifteenth of its original strength by irradiating the adhesive 12 with ultraviolet light. The light-shielding mask N is aligned with the wafer 1 by the procedure described above with reference to FIGS. 4 and 5.

Figure 11A:
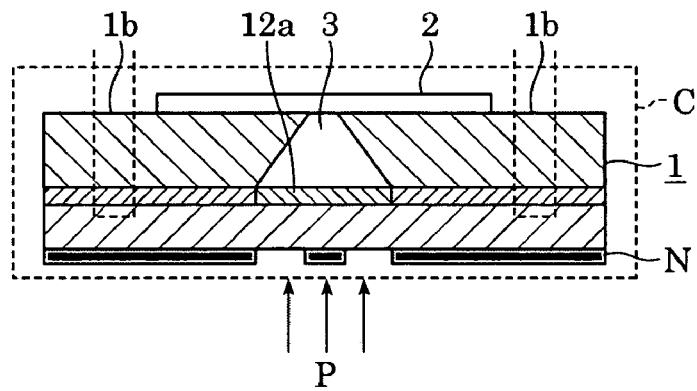
FIGS. 11A and 11B are illustrations showing a dicing step according to the second embodiment.
Figure 11B:
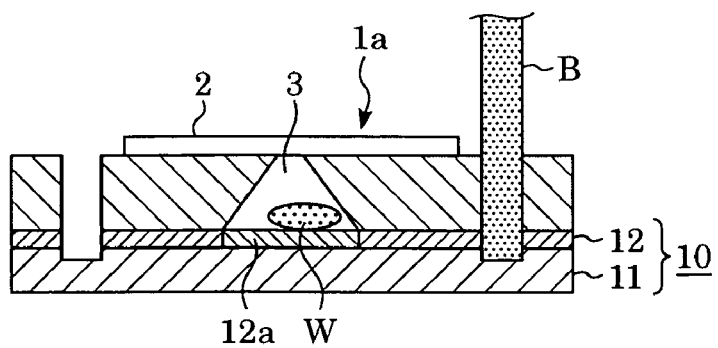

In order to prevent radical species from being deactivated due to oxygen in air, it is necessary to reduce the content of oxygen in the atmosphere of the liquid supply ports 3 by purging oxygen molecules from the liquid supply ports 3 using nitrogen gas or the like prior to the irradiation of ultraviolet light. Therefore, as shown in FIG. 11A, the wafer 1 is housed in a chamber C and nitrogen gas is introduced into the chamber C, whereby the content of oxygen in the atmosphere of the chamber C is reduced to less than 2%. The resulting chamber C is allowed to stand for a predetermined time. This leads to a decrease in the content of oxygen in the atmosphere of the liquid supply ports 3 to prevent the radical polymerization activity of the adhesive 12 partly exposed in the liquid supply ports 3 from being reduced.

The intensity of ultraviolet light P used is 600 mj/cm$^2$ (determined at a wavelength of 365 nm). Irradiation conditions of ultraviolet light P may be selected such that adhesive layers 12a with low adhesive strength are formed by irradiating the dicing tape 10, affixed to the rear face of the wafer 1, with ultraviolet light P and becomes substantially tack-free.

The regions of the adhesive 12 that have been irradiated with ultraviolet light P are converted into adhesive layers 12a having low or substantially no adhesive strength. Other regions of the adhesive 12 that have not been irradiated with ultraviolet light P retain their adhesive strength during a dicing step shown in FIG. 11B, and therefore securely fix the wafer 1 to the dicing tape 10.

FIG. 12 shows the light-shielding mask N which includes a chromium layer for blocking ultraviolet light, which functions as a photomask, and which is in contact with the rear face of the wafer 1. With reference to FIG. 12, the two element sections 1a are arranged at a pitch of about 2,080 μm. Although one second mask section Nc is omitted from one of the element sections 1a that is placed on the left side, this element section 1a has the same configuration as that of one placed on the right side.

The liquid supply ports 3 arranged in the rear face of the wafer 1 have a length of about 6,270 μm and a width of about 1,000 μm. The perforations No corresponding to the liquid supply ports 3 have a size greater than that of the liquid supply ports 3 in view of the accuracy in aligning the wafer 1 with the wafer 1 and have a length of about 6,290 μm and a width of about 1,020 μm; that is, each side of the perforations No is about 10 μm longer than that of the liquid supply ports 3. The second mask sections Nc having a length of about 5,470 μm and a width of about 300 μm are each placed in the corresponding perforations No.

FIG. 10 is a sectional view showing the element sections 1a and the light-shielding mask N when viewed from the side. The adhesive 12 lying over the liquid supply ports 3 having a width of about 1,000 μm is directly exposed to ultraviolet light P passing through the perforations No having spaces with a width of about 360 μm. The irradiated regions of the adhesive 12 that are exposed in the liquid supply ports 3 extend from the edges of the liquid supply ports 3 to positions about 350 μm apart from the edges. In a sectional view showing the element sections 1a and the light-shielding mask N when viewed in the longitudinal direction of the perforations No, the relationship between the light-shielding mask N and the liquid supply ports 3 is the same as described above. A portion of ultraviolet light P passing through the perforations No of the first mask sections Ne is absorbed by the adhesive 12 when first regions of the adhesive layers 12a are cured, the first regions being each surrounded by first ellipse E. The rest of ultraviolet light P passes through the first regions, is reflected by the walls of the liquid supply ports 3, and is then applied to second regions of the adhesive layers 12a that are covered with the second mask sections Nc, the second regions being each surrounded by second ellipse F as shown in FIG. 10.

The walls of the liquid supply ports 3 formed by an anisotropic etching process are inclined and are not completely flat but are irregular. A portion of ultraviolet light P entering the liquid supply ports 3 is scattered by the irregularities of the inclined walls of the liquid supply ports 3. Therefore, although the perforations No each have corresponding zones with an area less than that of the liquid supply ports 3 when viewed in the direction of the rear face of the wafer 1, the second regions covered with the second mask sections Nc are cured by the effect of ultraviolet light P that is scattered by the irregularities of the inclined walls after it passes through the dicing tape 10.

According to experiments conducted by the inventors, the cured regions of the adhesive 12 have a width of about 1,100 to 1,200 μm, including sub-regions which are located under center portions of the liquid supply ports 3 and which are covered with the second mask sections Nc.

After the adhesive 12 is partly cured, the wafer 1 is diced with a dicing blade B, whereby the element sections 1a are separated from each other. Dicing conditions are as follows: a blade thickness of 50 μm, a feed rate of 30 mm/s, and a blade rotation speed of 50,000 rpm. A procedure of dicing the wafer 1 with the dicing blade B is the same as that described in the first embodiment with reference to FIG. 6.

Although micro-vibration occurs in the wafer 1 during dicing, pieces that may be removed from the adhesive layers 12a having low adhesive strength by the micro-vibration cannot adhere to areas around orifices 5 connected to the liquid supply ports 3.

In a step of removing cooling water that enters the liquid supply ports 3 through the orifices 5 during dicing or during cleaning performed subsequent to dicing from the liquid supply ports 3 by air blowing, shock is applied to the adhesive layers 12a exposed in the liquid supply ports 3 from air and water flowing into the liquid supply ports 3. However, since the adhesive layers 12a have been cured, pieces are hardly removed from the adhesive layers 12a. Even if such pieces are removed therefrom, the pieces cannot adhere to areas around the liquid supply ports 3.

According to this embodiment, the cured regions of the adhesive 12 that have low adhesive strength can be precisely defined. This prevents problems from occurring during dicing performed subsequent to curing.

In contrast, if regions of the adhesive 12 that correspond to the liquid supply ports 3 are irradiated with ultraviolet light P under the same conditions as described above except the use of the second mask sections Nc, these regions are cured and have a large width, that is, a width of about 1,600 to 1,700 μm, without depending on the irradiation dose. This causes problems such as chipping to occur during dicing.

Figure 13:
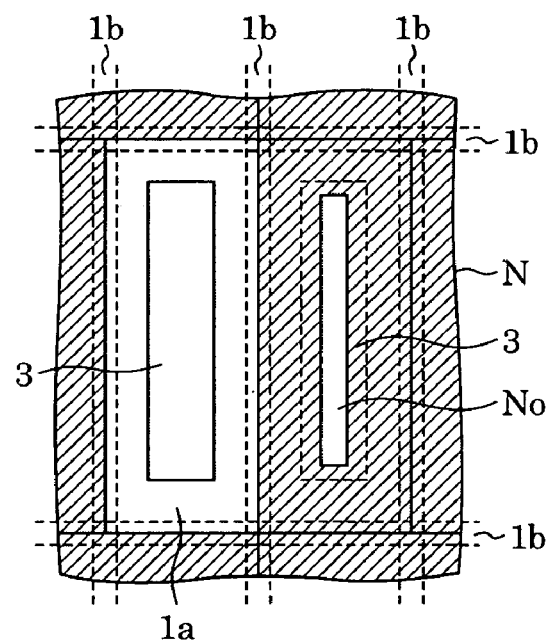
FIG. 13 is an illustration showing a variation of the method according to the second embodiment.

As shown in FIG. 13, another type of light-shielding mask N may be used for irradiation. This light-shielding mask N has perforations (light-transmissive sections) No of which the mouths with an area slightly less than that of the mouths of the liquid supply ports 3 but includes no nozzle layers 2. That is, this light-shielding mask N has openings through which light passes and which have an area less than that of the mouths of the liquid supply ports 3.

In this embodiment, the element sections 1a each have one liquid supply port 3. Each element section 1a may have a plurality of the liquid supply ports 3 arranged alternately or in parallel.

As shown in FIGS. 7 and 8, the following recorder can be manufactured using element substrates prepared by the dicing method of this embodiment: a liquid-discharging recorder including a liquid-discharging head including such element substrates. Since the liquid-discharging recorder including the liquid-discharging head, droplets are not discharged in random directions but can be constantly discharged from the liquid-discharging head. Furthermore, since orifice plugging and a failure in discharging do not occur during the use of the liquid-discharging recorder for a long time, the liquid-discharging recorder is high in reliability.

Third Embodiment

In the second embodiment, in order to prevent problems due to adhesive pieces derived from the dicing tape 10 from occurring, regions of the adhesive 12 that are exposed in the liquid supply ports 3 are cured and therefore reduced in adhesive strength before dicing is performed, whereby adhesive particles are created from the regions. Furthermore, it is necessary to prevent chippings from being created from portions of the adhesive 12 that correspond to the dicing streets 1b extending along cutting lines along which the wafer 1 is diced. In order to prevent such adhesive chippings from being created from the adhesive 12 subjected to dicing using a blade, the portions of the adhesive 12, which is included in the dicing tape 10, are cured before dicing is performed.

There are problems described below when the following regions and portions are simultaneously cured and therefore reduced in adhesive strength: the regions of the adhesive 12 that are exposed in the liquid supply ports 3 and the portions of the adhesive 12 that correspond to the dicing streets 1b.

Figure 14A:
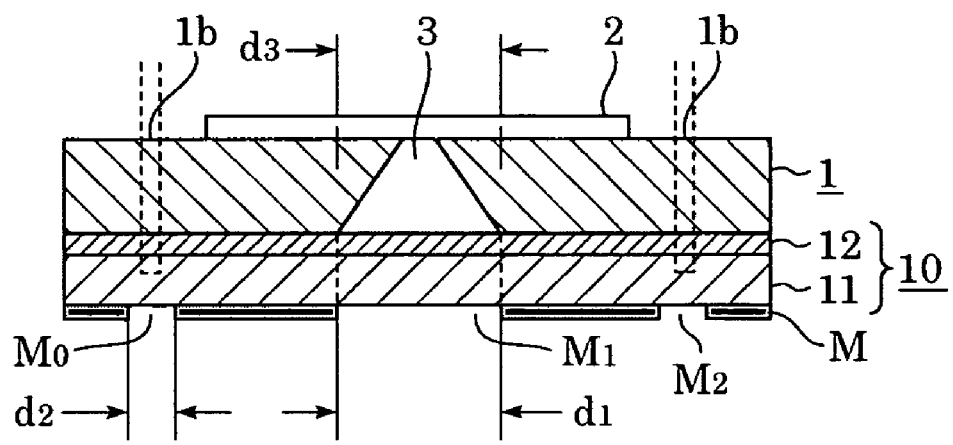
FIGS. 14A and 14B are illustrations showing an increase in pattern size occurring in a region partly cured in a step included in a dicing method according to a third embodiment.

As shown in FIG. 14A, a light-shielding mask M has first light-transmissive sections M1 for curing the regions of the adhesive 12 that are exposed in the liquid supply ports 3 and second light-transmissive sections M2 corresponding to the dicing streets 1b. The width d1 of the first light-transmissive sections M1 is set to about 1,020 μm when the width d3 of the liquid supply ports 3 is, for example, about 1,000 μm; that is, the width d1 of the first light-transmissive sections M1 is close to the width d3 of the liquid supply ports 3. The width d2 of the second light-transmissive sections M2 is set to about 120 μm when a dicing blade used has a thickness of about 50 μm; that is, the width d2 of the second light-transmissive sections M2 is between two to three times the thickness of the dicing blade.

In order to prevent such adhesive chippings from being created, it is necessary to sufficiently cure zones of the adhesive 12 that the dicing blade penetrates. Therefore, in order to form adhesive layers 12a by curing regions of the adhesive 12 that correspond to the liquid supply ports 3 and in order to form adhesive layers 12b by curing regions of the adhesive 12 that correspond to the dicing streets 1b under the same irradiation conditions (at the same irradiation dose), exposure conditions for forming the adhesive layers 12b are primarily selected; hence, the lower limit of the irradiation dose of ultraviolet light P is limited.

Figure 14B:
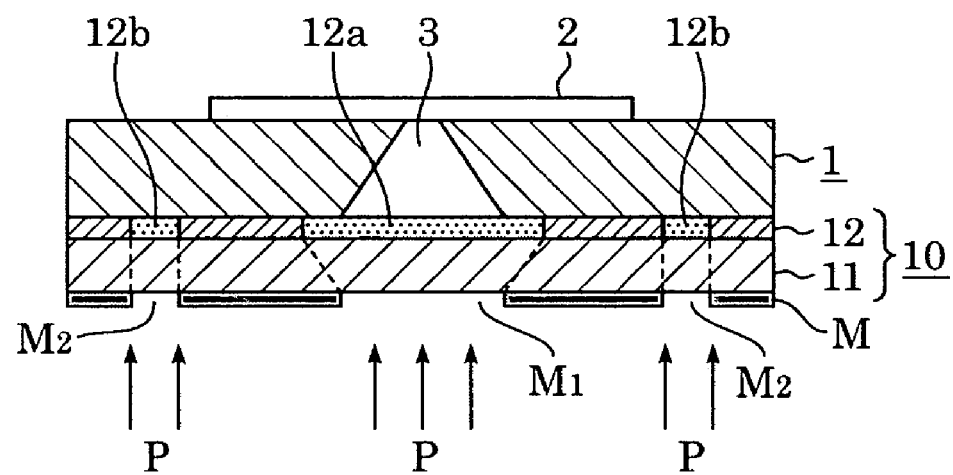

With reference to FIG. 14B, although the width of the adhesive layers 12a is determined depending on that of the first light-transmissive sections M1 and the width of the adhesive layers 12b is determined depending on that of the second light-transmissive sections M2, the width of the adhesive layers 12a exceeds that of the first light-transmissive sections M1 and the width of the adhesive layers 12b exceeds that of the second light-transmissive sections M2 because ultraviolet light P is scattered or reflected by the rear face of the wafer 1 when it passes through the bucking 11. This phenomenon is referred to as an increase in pattern size.

If the irradiation dose of ultraviolet light P is constant, the increase in pattern size increases with the size of the first and second first light-transmissive sections M1 and M2. Therefore, the increase in size of the adhesive layers 12a formed by curing regions of the adhesive 12 that correspond to the liquid supply ports 3 is more serious than that of the adhesive layers 12b formed by curing regions of the adhesive 12 that correspond to the dicing streets 1b. This is because the liquid supply ports 3 have a three-dimensional structure similar to a reflector shape and incident light is reflected or scattered in the liquid supply ports 3. If the adhesive layers 12b are completely cured by irradiation, the resulting adhesive layers 12b have a width of about 150 μm even though the second light-transmissive sections M2 have a width of about 120 μm, and the adhesive layers 12a have a width of about 1,600 μm even though the first light-transmissive sections M1 have a width of 1,020 μm.

The wafer 1 is loosely fixed during dicing after the adhesive 12 is partly cured. Therefore, minimum regions of the adhesive 12 are selectively cured. However, the cured regions of the adhesive 12 that correspond to the liquid supply ports 3 are apt to have a width greater than a required value as described above; that is, an increase in pattern size occurs.

A third embodiment of the present invention provides a dicing method described below. According to this method, adhesive pieces are effectively prevented from being created from an adhesive of a dicing tape during the dicing of a wafer and the wafer can be securely fixed during the dicing.

As shown in FIG. 1, the following sections are formed on the front face of a wafer 1 having dicing streets 1b for dicing: a large number of element sections 1a for manufacturing element substrates for liquid-discharging heads. A dicing tape 10 including a bucking 11 and an adhesive 12 placed thereon is affixed to the rear face of the wafer 1. A light-shielding mask M having light-transmissive sections M2 through which light passes is aligned with the wafer 1 by the procedure described above with reference to FIGS. 4 and 5.

Figure 15:
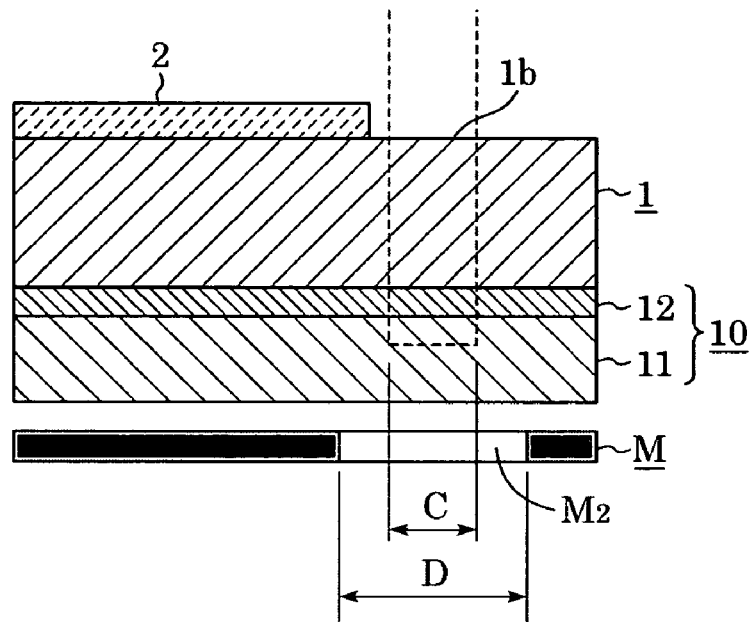
FIG. 15 is an illustration showing the pattern of light-transmissive sections, arranged in a light-shielding mask, corresponding to dicing streets.
Figure 16:
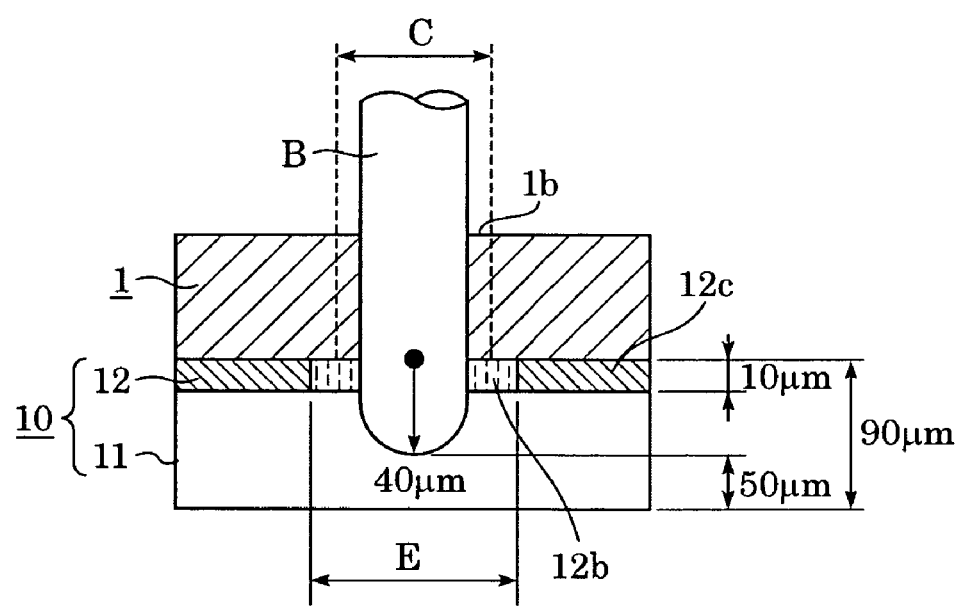
FIG. 16 is an illustration showing the depth of a portion that a dicing blade penetrates.

As shown in FIGS. 15 and 16, adhesive layers 12b are formed by irradiating regions of the adhesive 12 with ultraviolet light P passing through the light-transmissive sections M2 to cure the regions. The width of the light-transmissive sections M2 is represented by D. In consideration of the misalignment between the light-shielding mask M and the dicing streets 1b, the following inequality is set:

$$E > C$$

wherein E represents the width of the adhesive layers 12b and C represents the design value of the width of dicing streets 1b.

In this embodiment, the design value C of the width of dicing streets 1b is about 80 μm and the width D of the light-transmissive sections M2 is about 150 μm in consideration of the misalignment between the light-shielding mask M and the wafer 1.

With reference to FIG. 16, the design value C of the width of dicing streets 1b is less than the width E of the adhesive layers 12b because the width E of the adhesive layers 12b is set in consideration of the misalignment described above. Therefore, a dicing blade B does not penetrate uncured regions 12c of the adhesive 12 that have adhesive strength. Since the dicing tape 10 is securely bonded to the wafer 1 having the element sections 1a, the element sections 1a are prevented from being scattered and the wafer 1 and/or the element sections 1a are prevented from being chipped during dicing.

Figure 17:
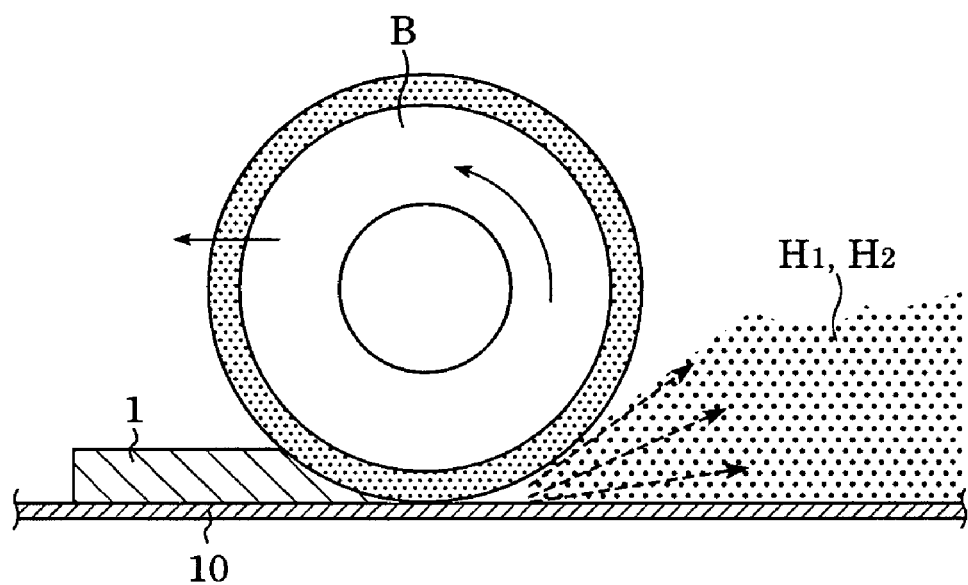
FIG. 17 is an illustration showing cutting dust created during dicing.

As shown in FIG. 17, first cutting dust H1 and second cutting dust H2 are created from the wafer 1 and the cured regions of the dicing tape 10, respectively, during dicing and then scattered due to the rotation of the dicing blade B. The first cutting dust H1 and the second cutting dust H2 adhere to the wafer 1 during dicing. The resulting first cutting dust H1 can be removed from the wafer 1 in a cleaning step conducted subsequent to dicing. The resulting second cutting dust H2 can also be removed from the wafer 1 in the cleaning step because it has been created from the cured regions of the dicing tape 10 and therefore has low adhesive strength.

Figure 18A:
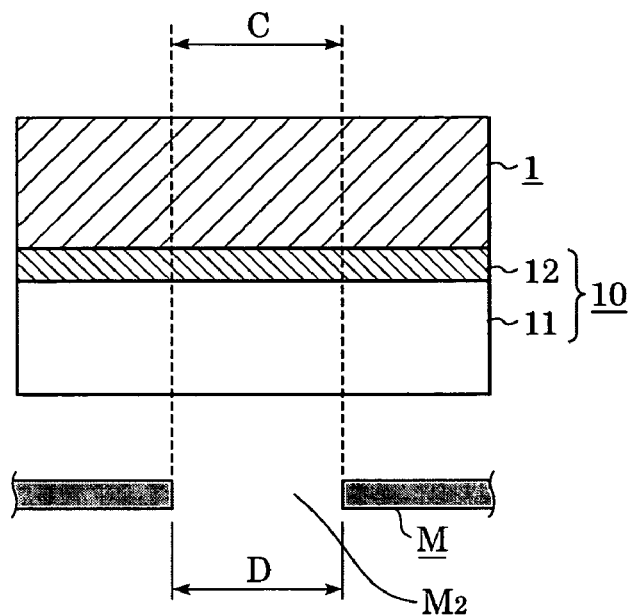
FIGS. 18A and 18B are illustrations showing a dicing method for comparison, the method being used in a situation in which dicing streets have a width equal to that of cured regions of an adhesive layer.
Figure 18B:
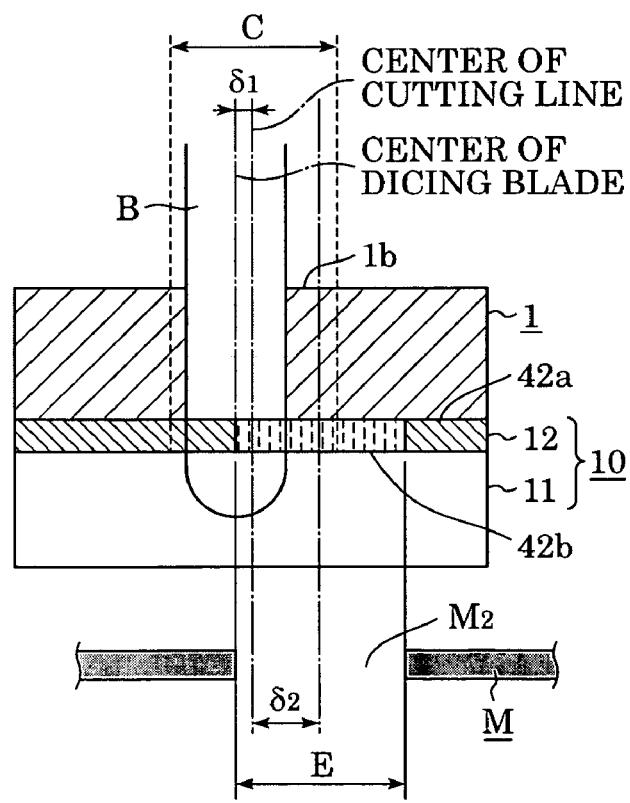

FIG. 18 shows a dicing method for comparison. When the design value C of the width of dicing streets 1b is equal to the width E of the adhesive layers 12b, the following problem can occur: a problem in that the dicing blade B penetrates a portion seriously apart from the adhesive layers 12b formed by partly curing the adhesive 12. This problem is due to the misalignment δ1 between the center of the dicing blade B and that of the dicing streets 1b and the misalignment δ2 between the light-shielding mask M and the wafer 1. That is, the dicing blade B may penetrate the uncured regions 12c having adhesive strength; hence, adhesive cutting dust is scattered. This problem is the same as that arising from known dicing methods.

Figure 19A:
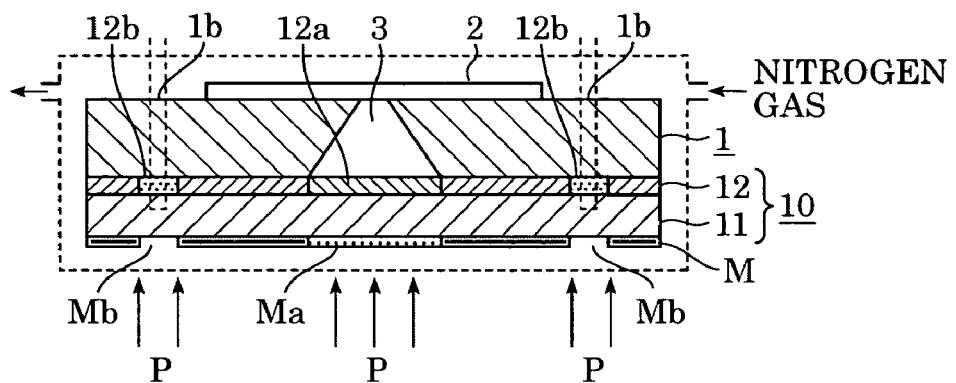
FIGS. 19A and 19B are illustrations showing a former part of a dicing step according to a third embodiment of the present invention.
Figure 19B:
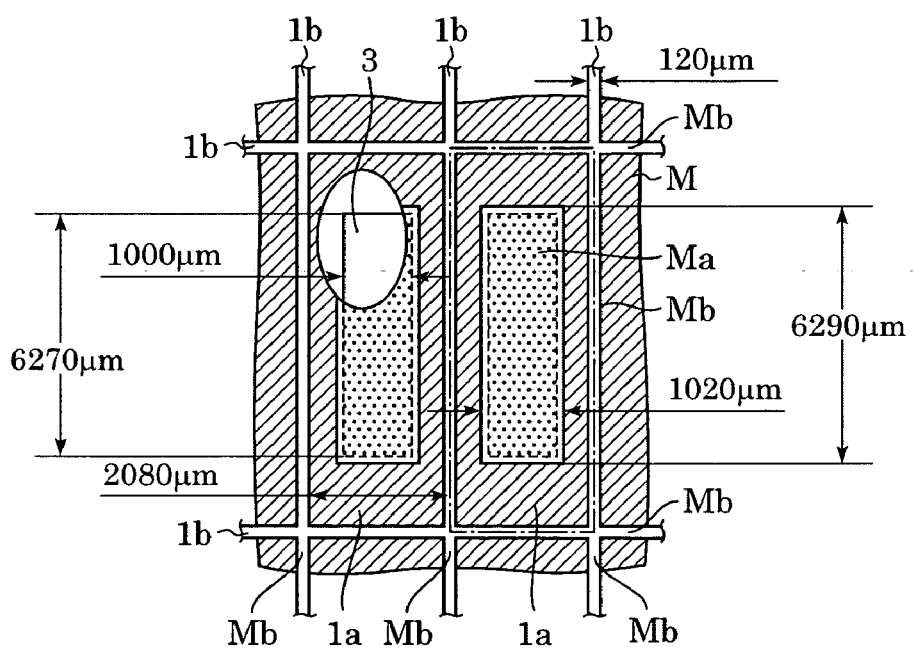

However, in this embodiment, as shown in FIGS. 19A-B, the rear face of the wafer 1 is irradiated with ultraviolet light P using the light-shielding mask M before dicing is conducted and only regions of the adhesive 12 that correspond to the liquid supply ports 3 or the dicing streets 1b are thereby cured and therefore reduced in adhesive strength. In this operation, the regions of the adhesive 12 that correspond to the liquid supply ports 3 are converted into adhesive layers 12a and the regions of the adhesive 12 that correspond to the dicing streets 1b are converted into the adhesive layers 12b. The adhesive layers 12a and 12b have low adhesive strength. Therefore, as shown in FIG. 20, when shock is applied to the element sections 1a by air blowing conducted to remove cooling water W entering the liquid supply ports 3 during dicing, adhesive particles are prevented from being created in the liquid supply ports 3. Even if such adhesive particles and/or low-molecular weight components are created, the adhesive particles and/or the low-molecular weight components have low adhesive strength and cannot therefore adhere to areas around orifices 5 arranged in nozzle layers 2 included in the element sections 1a. Furthermore, adhesive pieces can be prevented from being created from any portion that the dicing blade B penetrates.

The light-shielding mask M further has first light-transmissive sections Ma which correspond to the liquid supply ports 3, which is opaque, and which has low ultraviolet transmission. The first light-transmissive sections Ma are useful in preventing the increase in pattern size from occurring when the adhesive 12 is partly cured; hence, the wafer 1 can be securely fixed or retained during dicing.

Since dicing can be efficiently performed without causing problems arising from adhesive pieces, the following head can be manufactured without causing any problems: a liquid-discharging head in which no orifice plugging nor a failure in discharging due to adhesive particles occurs and which has high quality and reliability.

The shape of the liquid supply ports 3 and the configuration of adhesion of the dicing tape 10 are the same as described above.

As shown in FIG. 19A, the rear face of the wafer 1 is irradiated with ultraviolet light P, obtained from an ultraviolet irradiation system including a high-pressure mercury-vapor lamp, using the light-shielding mask M. The adhesive 12 is usually cured by irradiating the adhesive 12 with ultraviolet light having an intensity of about 400 mJ/cm$^2$ (determined at a wavelength of 365 nm). In this embodiment, ultraviolet light P having an intensity of about 600 mJ/cm$^2$ (determined at a wavelength of 365 nm) is applied to the bucking 11 with the ultraviolet irradiation system, whereby the adhesive 12 is partly cured and the cured parts become tack-free. In this operation, as described above with reference to FIG. 2, in order to prevent radical species from being deactivated due to oxygen in air, it is necessary to reduce the content of oxygen in the atmosphere of the liquid supply ports 3, in which the adhesive 12 is partly exposed, by introducing nitrogen gas into the liquid supply ports 3. This leads to a decrease in the content of oxygen in the atmosphere of the liquid supply ports 3 to prevent the radical polymerization activity of the adhesive 12 partly exposed in the liquid supply ports 3 from being reduced.

With reference to FIG. 19B, the light-shielding mask M used for ultraviolet irradiation, which is a kind of photomask including a chromium layer for blocking ultraviolet light, further includes second light-transmissive sections Mb corresponding to the dicing streets 1b. The light-shielding mask M is applied to the bucking 11 of the dicing tape 10 affixed to the rear face of the wafer 1 in such a manner that the first and second light-transmissive sections Ma and Mb correspond to the element sections 1a arranged on the front face of the wafer 1 at intervals of about 2,080 μm. The element sections 1a may be referred to as chips.

Since the dicing blade B used in a subsequent dicing step has a thickness of about 50 μm, the width of the second light-transmissive sections Mb is set to about 120 μm in consideration of displacement that may occur during dicing.

The mouths of the liquid supply ports 3 have a length of about 6,270 μm and a width of about 1,000 μm. The first light-transmissive sections Ma for subjecting regions of adhesive 12 that lie over the liquid supply ports 3 to exposure have a length of about 6,290 μm and a width of about 1,020 μm; that is, the length and width of the first light-transmissive sections Ma are about 10 μm longer than those of the mouths of the liquid supply ports 3. The first light-transmissive sections Ma are not transparent but opaque as described above. The first light-transmissive sections Ma have an ultraviolet transmittance equal to about 35% of that of the second light-transmissive sections Mb; that is, the intensity of ultraviolet light passing the first light-transmissive sections Ma is reduced to about one third of its original intensity.

After nitrogen gas is introduced into a chamber C in which the wafer 1 is placed and the content of oxygen in the atmosphere of the liquid supply ports 3 is reduced, ultraviolet light P is applied to the bucking 11. The irradiation dose of ultraviolet light P is about 1,200 mJ/cm$^2$. Regions of the adhesive 12 that extend along the dicing streets 1b are irradiated with ultraviolet light P with a dose of about 1,200 mJ/cm$^2$ that is about three times greater than the dose that is necessary to render the adhesive 12 tack-free, whereby these regions are cured and converted into the adhesive layers 12b. On the other hand, other regions of the adhesive 12 that lie over the liquid supply ports 3 are irradiated with ultraviolet light P with a dose of about 420 mJ/cm$^2$ because the intensity of ultraviolet light P is reduced when ultraviolet light P passes through the first light-transmissive sections Ma, whereby surface portions of these regions are cured and converted into the adhesive layers 12a which are tack-free, that is, which are lost in adhesive strength.

The adhesive layers 12b have a width of about 150 µm, even though the second light-transmissive sections Mb have a width of about 120 µm. The adhesive layers 12a have a width of about 1,100 µm and a length of about 6,350 µm, even though the first light-transmissive sections Ma have a width of about 1,020 µm and a length of about 6,290 µm. When a photomask having the same configuration as that of the light-shielding mask M except that first light-transmissive sections Ma have a transmittance of 100% is used for comparison, the adhesive layers 12a have a width of about 1,600 µm and a length of about 6,700 µm and the dicing tape 10 has reduced adhesive strength insufficient to securely fix the wafer 1 during dicing. As is clear from this fact, according to this embodiment, the surface portions of the adhesive regions lying over the liquid supply ports 3 can be cured, the increase in pattern size can be prevented from occurring, and the cured surface portions can be controlled such that they correspond to the liquid supply ports 3 or slightly extend out of the liquid supply ports 3; hence, problems can be prevented from occurring during dicing.

If the first light-transmissive sections Ma of the light-shielding mask M have an appropriate transmittance and the irradiation dose of ultraviolet light is proper, the following advantages can be achieved: the adhesive regions corresponding to the dicing streets 1b can be sufficiently cured such that dust arising from the adhesive layers 12b during dicing have sufficiently low adhesive strength, only the surface portions of the adhesive regions lying over the liquid supply ports 3 can be cured such that peelings and/or elutants are prevented from arising from the adhesive layers 12a, and the increase in pattern size can be prevented from occurring in the adhesive layers 12a such that chipping is prevented from occurring during dicing.

Figure 20A:
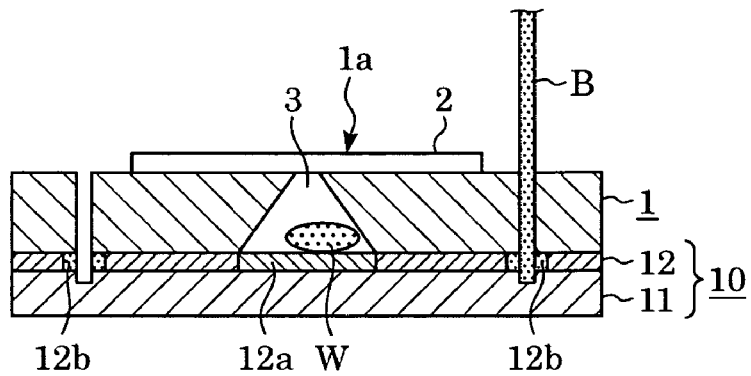
FIGS. 20A-C are illustrations showing a latter part of the dicing step according to the third embodiment.

As shown in FIG. 20A, after the adhesive 12 is selectively cured, the wafer 1 is diced with the dicing blade B, whereby the element sections 1a are separated from each other. The positions of the edge of the dicing blade B, the wafer 1, and the dicing tape 10 during dicing are the same as those described above with reference to FIG. 6.

Figure 20B:
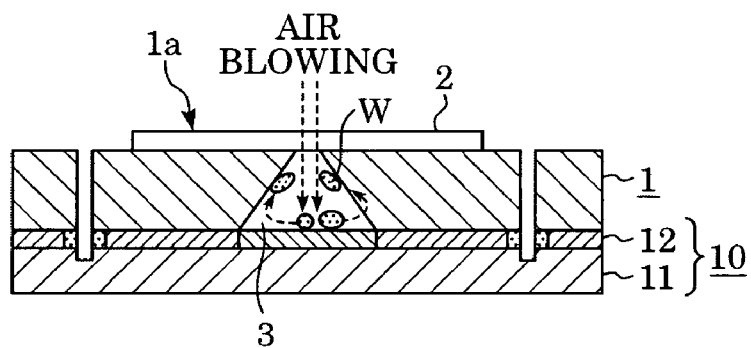
Figure 20C:
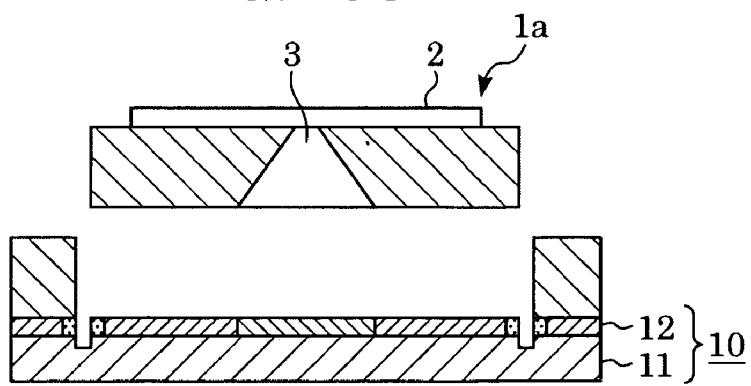

FIGS. 20B and 20C each show a step of removing cooling water W, entering the liquid supply ports 3 through the orifices 5 (openings through which liquid such as ink is discharged) during dicing or during cleaning conducted subsequent to dicing, from the liquid supply ports 3 by air blowing, the orifices 5 being arranged in the nozzle layers 2. In this step, although shock is applied to the adhesive layers 12a exposed in the liquid supply ports 3 from air and water introduced into the liquid supply ports 3, pieces are hardly removed from the cured surface portions of the adhesive layers 12a. Even if such pieces are removed therefrom, the pieces cannot adhere to the walls of the liquid supply ports 3 nor areas around the liquid supply ports 3. Thus, as shown in FIG. 20C, no adhesive particles remain in the liquid supply ports 3 when the element sections 1a are picked up.

In this embodiment, the element sections 1a each have one liquid supply port 3. Each element section 1a may have a plurality of the liquid supply ports 3 arranged alternately or in parallel.

Figure 21:
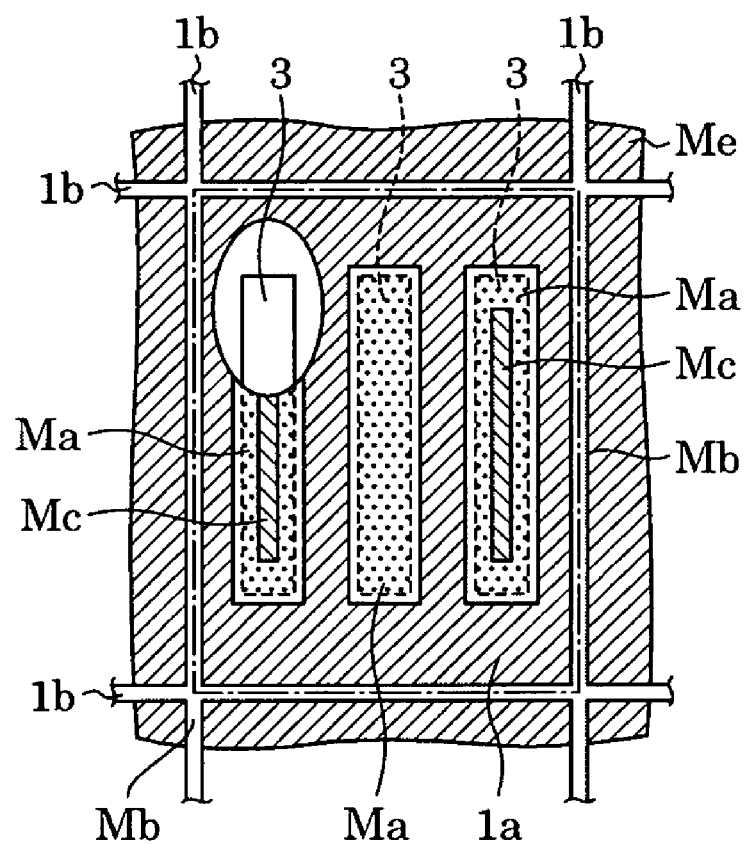
FIG. 21 is an illustration showing a variation of the dicing step according to the third embodiment.

FIG. 21 shows another type of light-shielding mask Me attached to element sections 1a each having three liquid supply ports 3. This light-shielding mask Me has three first light-transmissive sections Ma with a transmittance of 30% and two second light-transmissive sections Mc, each placed in the outermost light-transmissive sections Ma, having transmittance of 50%. The first light-transmissive sections Ma correspond to the liquid supply ports 3. Therefore, ultraviolet light can be applied to adhesive layers 12a lying over the liquid supply ports 3 with a sufficient irradiation dose and the increase in pattern size can be securely prevented from occurring in adhesive layers 12b lying over dicing streets 1b surrounding the liquid supply ports 3.

Figure 22:
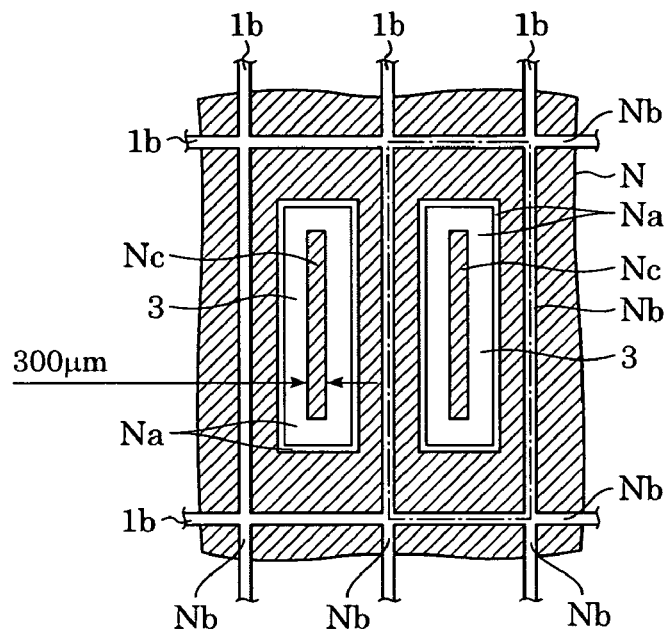
FIG. 22 is an illustration showing another variation of the dicing step according to the third embodiment.

FIG. 22 shows another type of light-shielding mask N including first light-transmissive sections Na having a transmittance of 100%, second light-transmissive sections Nb having a transmittance of 100%, and light-blocking sections Nc each placed in the corresponding first light-transmissive sections Na. The first light-transmissive sections Na correspond to adhesive layers 12a lying over liquid supply ports 3 having a length of about 6,270 µm and a width of about 1,000 µm and have spaces having an area less than that of the mouths of the liquid supply ports 3. The second light-transmissive sections Nb correspond to dicing streets 1b. The light-blocking sections Nc has a width of about 300 µm and an area equal to about 38% of that of the mouths of the liquid supply ports 3. The adhesive layers 12a and the dicing streets 1b may be irradiated with ultraviolet light using the light-shielding mask N. In this operation, the dose of ultraviolet light applied to the adhesive layers 12a is less than that applied to the dicing streets 1b. That is, since the light-blocking sections Nc are placed in the first light-transmissive sections Na, the dose of ultraviolet light applied to the adhesive layers 12a is 38% less than that applied to the first light-transmissive sections Na. Ultraviolet light passes through the spaces surrounding the light-blocking sections Nc to cure surface portions of the adhesive layers 12a having a width of about 150 µm and also passes through the second light-transmissive sections Nb to cure the surface portions; hence, the surface portions over which the light-blocking sections Nc lie are also cured.

Figure 23A:
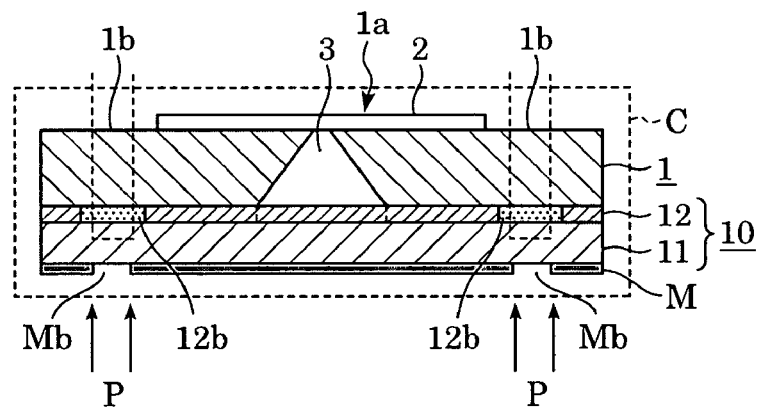
FIGS. 23A and 23B are illustrations showing another variation of the dicing step according to the third embodiment.
Figure 23B:
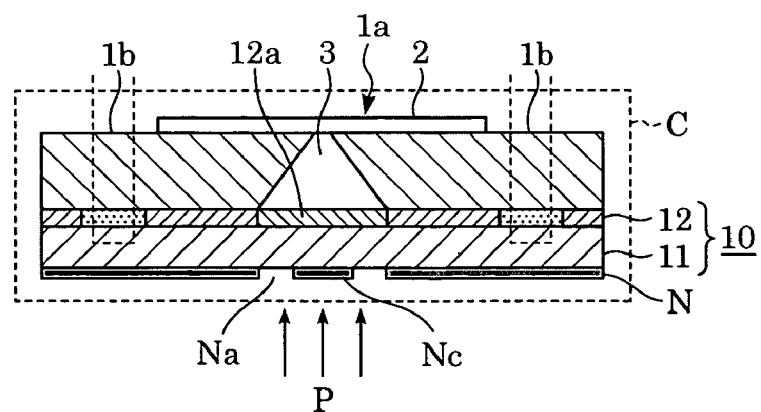

FIGS. 23A-B show a first step of curing adhesive layers 12a, arranged in an adhesive 12, lying over liquid supply ports 3 using a first light-shielding mask N having no sections similar to the second light-transmissive sections Nb described above and also shows a second step of curing adhesive layers 12b arranged in the adhesive 12, extending along dicing streets 1b using a second light-shielding mask M having no sections similar to the first light-transmissive sections Ma described above. These steps may be separately performed.

According to this embodiment, when the adhesive 12 of the dicing tape 10, which lie over the liquid supply ports 3 arranged in the rear face of the wafer 1, is partly cured, the dose of ultraviolet light applied to regions of the adhesive 12 that correspond to the liquid supply ports 3 can be controlled to be less than that applied to other regions of the adhesive 12 that correspond to cutting lines; hence, adhesive particles can be prevented from remaining around the orifices 5 and various problems due to shock and vibration occurring during dicing can be effectively prevented. Accordingly, the following substrates can be manufactured by the dicing method of this embodiment without causing any problems: element substrates for semiconductor devices or liquid-discharging heads with high performance and reliability.

As shown in FIGS. 7 and 8, the following recorder can be manufactured using such element substrates prepared by the dicing method of this embodiment: a liquid-discharging recorder including a liquid-discharging head including the element substrates. The liquid-discharging head does not discharge any droplets in random directions but can constantly discharge droplets. Furthermore, an adhesive can be prevented from remaining in chambers in which ink remains for a long time; hence, orifices can be prevented from being plugged with elutants from the adhesive. Therefore, the liquid-discharging recorder has high reliability.

Fourth Embodiment

In the third embodiment, since ultraviolet light is applied to the adhesive regions corresponding to the dicing streets 1b and those corresponds to the liquid supply ports 3 with different doses each appropriate to the corresponding regions, adhesive cutting dust can be prevented from being created during dicing. A fourth embodiment of the present invention provides a method for curing an adhesive included in a dicing tape. This method based on the relationship between irradiated regions of the adhesive which correspond to dicing streets or liquid supply ports located close to the dicing streets and directions in which irradiation light is reflected by inner walls of the liquid supply ports and which depend on the internal shape of the liquid supply ports.

Figure 24A:
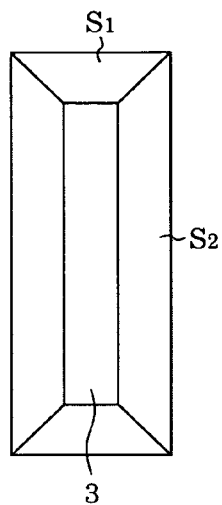
FIGS. 24A-C are illustrations showing a dicing method according to a fourth embodiment of the present invention.
Figure 24C:
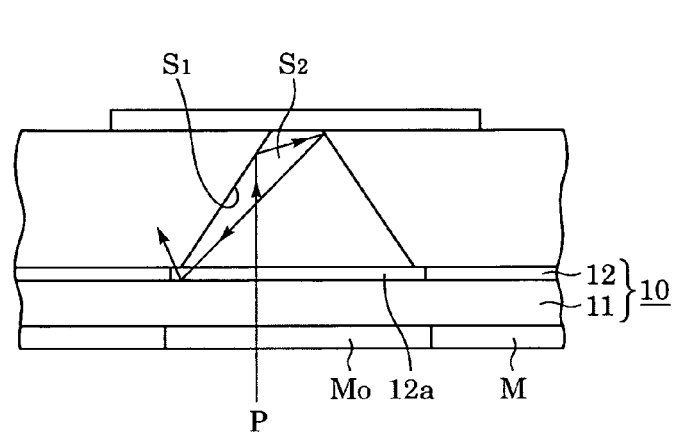
Figure 24B:
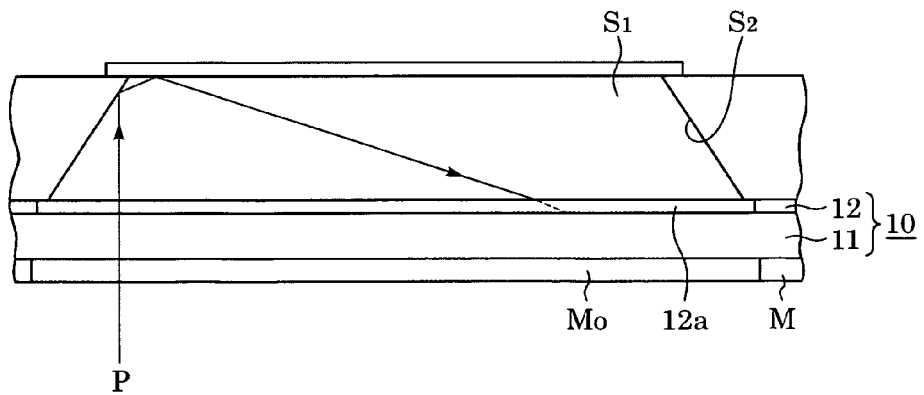

FIG. 24A shows one of liquid supply ports 3 arranged in a wafer. The liquid supply ports 3 have mouths having a rectangular shape with a large aspect ratio and have spaces. The spaces have a shape similar to a truncated quadrangular pyramid and each has two small trapezoidal walls S1 and two large trapezoidal walls S2. With reference to FIG. 24B, ultraviolet light P entering each space is reflected by one of the small trapezoidal walls S1 and then travels toward one of adhesive layers 12a, arranged in an adhesive 12 included in a dicing tape 10, lying over the liquid supply ports 3; hence, no problems occur. However, with reference to 24C, ultraviolet light P reflected by one of the large trapezoidal walls S2 travels toward a site of the adhesive layer 12a that is located close to a region of the adhesive 12 and is reflected by the interface between the adhesive layer 12a and a bucking 11 included in the dicing tape 10 and/or reflected by particles contained in the bucking 11, whereby regions of the adhesive 12 that are prevented from being irradiated with ultraviolet light P are cured. Therefore, when dicing streets 1b extending along sides of the large trapezoidal walls S2 are located close to the liquid supply ports 3, the adhesive layers 12a cured by ultraviolet light P are connected to cured adhesive layers 12b which are arranged in the adhesive 12 and which extend over the dicing streets 1b. In this case, the wafer that must be fixed to the adhesive 12 cannot be fixed thereto; hence, problems such as chipping occur when the wafer is diced.

FIG. 25 shows a light-shielding mask M having light-transmissive sections with a small size. If the light-shielding mask M is used and long sides of the mouths of the liquid supply ports 3, the long sides being located adjacent to the dicing streets 1b, are caused to retreat from their original positions, the adhesive layers 12a can be prevented from being connected to the adhesive layers 12b in contrast to the situation described above.

Figure 25A:
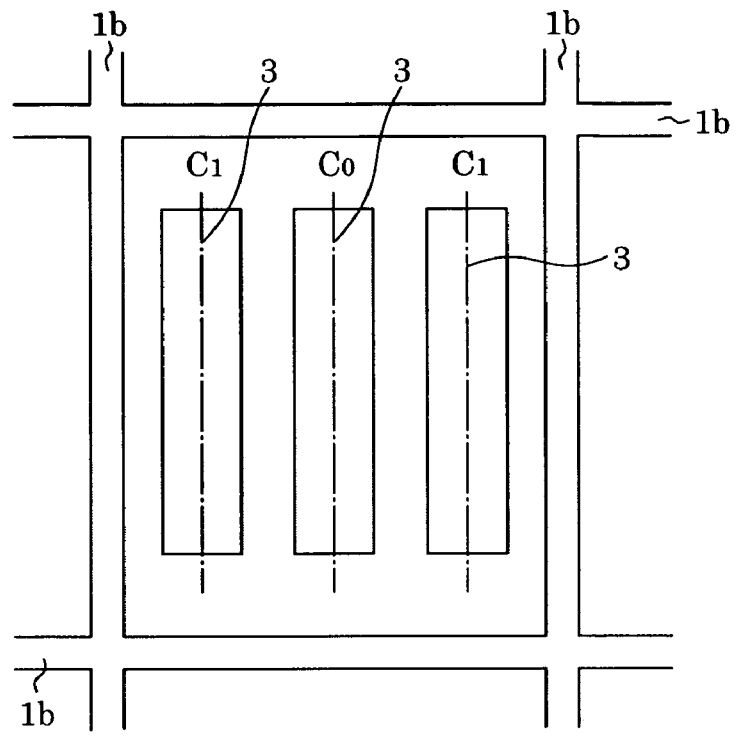
FIGS. 25A-C are illustrations showing light-transmissive sections arranged in a light-shielding mask according to the fourth embodiment.
Figure 25B:
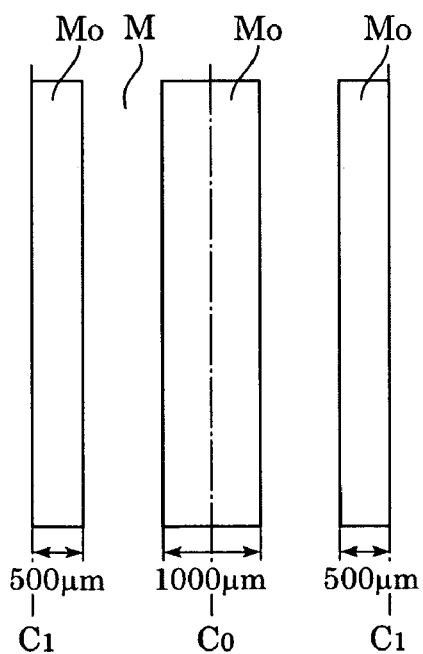
Figure 25C:
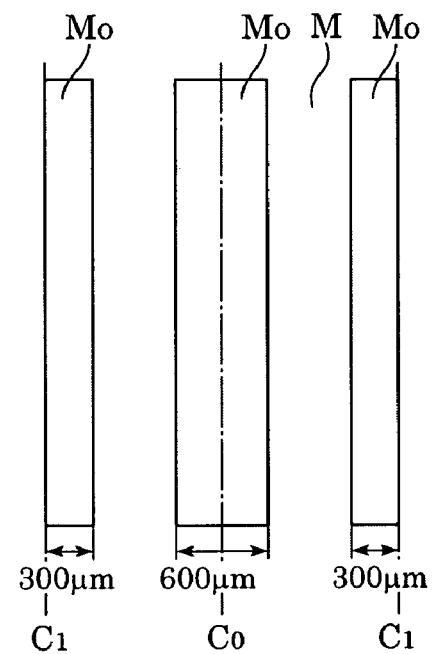
Figure 26A:
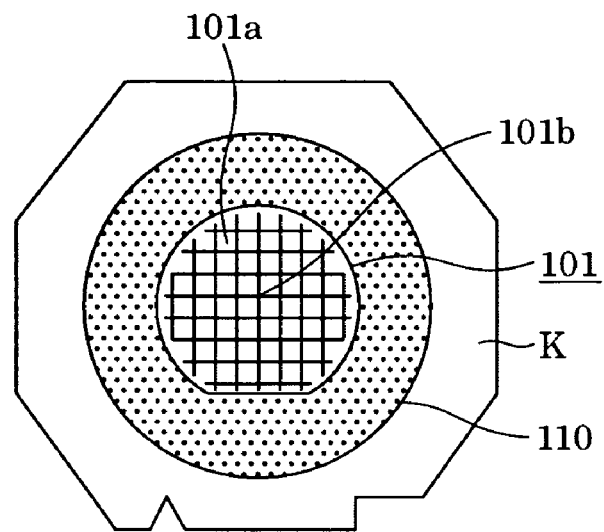
FIGS. 26A and 26B are illustrations showing a known dicing method.
Figure 26B:
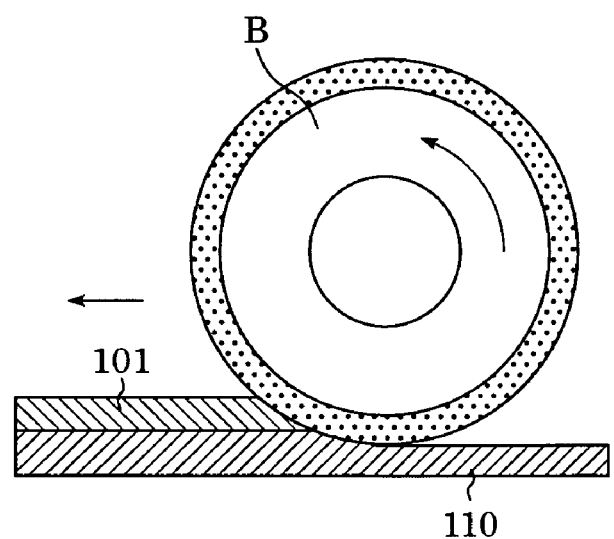
Figure 27:
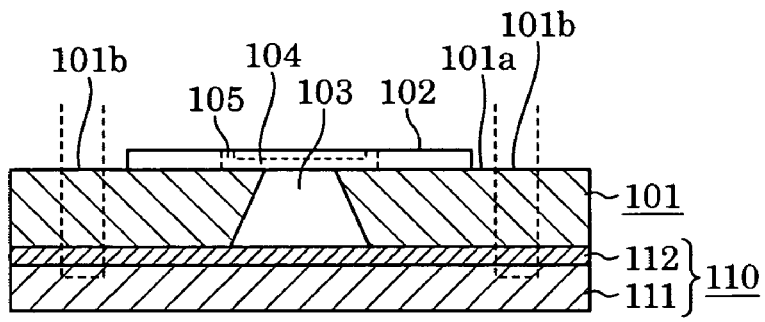
FIG. 27 is a fragmentary sectional view showing a part of a wafer shown in FIG. 26.
Figure 28A:
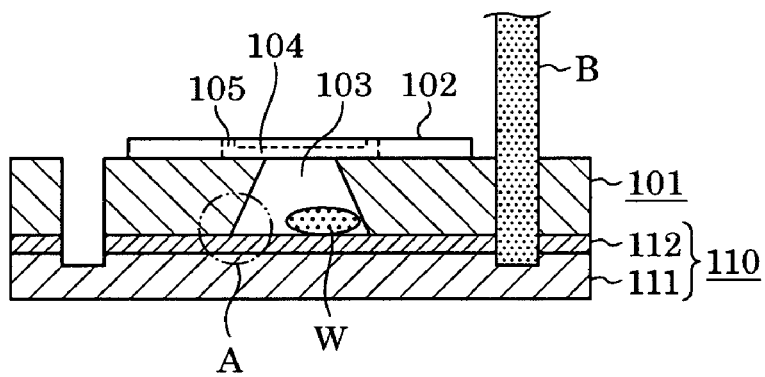
FIG. 28A is a schematic fragmentary sectional view showing a part of a wafer subjected to dicing.
Figure 28B:
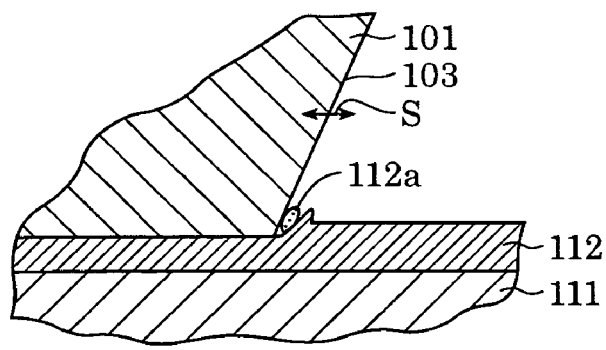
FIG. 28B is a partially enlarged view of circle A shown in FIG. 28A.
Figure 29A:
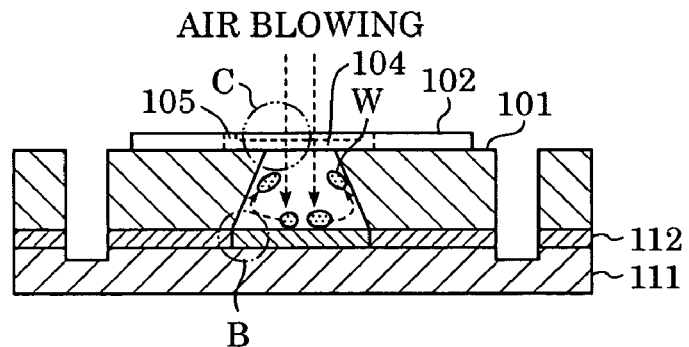
FIG. 29A is a schematic fragmentary sectional view showing a part of the wafer subjected to cleaning conducted subsequent to dicing.
Figure 29B:
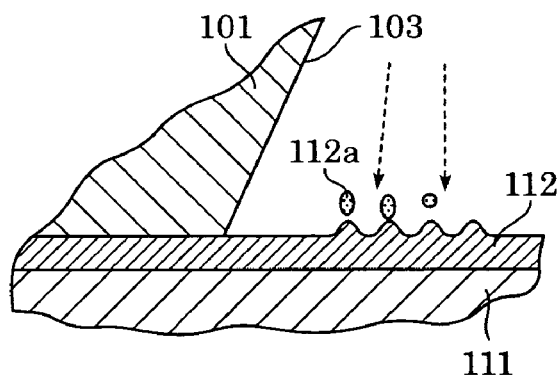
FIG. 29B is a partially enlarged view of circle B shown in FIG. 29A.
Figure 29C:
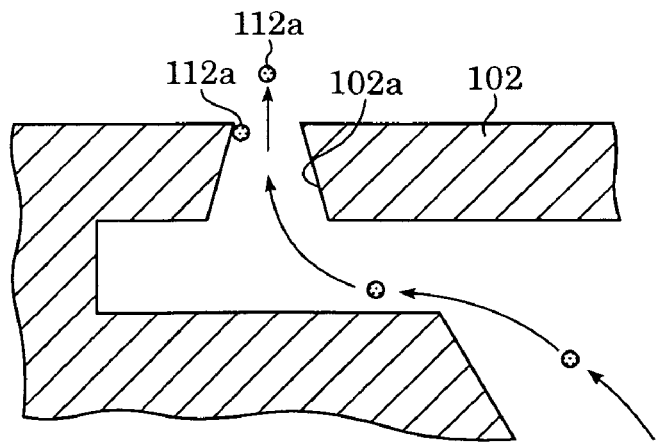
FIG. 29C is a partially enlarged view of circle C shown in FIG. 29A.

With reference to FIGS. 25A-C, a method for curing regions of adhesive 12 that correspond to the following ports will now be described: three liquid supply ports 3 arranged in parallel in a quadrilateral region of which the four sides extend along corresponding dicing streets 1b. If four or more liquid supply ports 3 are arranged therein, advantages described below can be obtained.

A light-shielding mask M having light-transmissive sections Mo is used. The light-transmissive sections Mo have a transmittance of 35% and correspond to the liquid supply ports 3. With reference to FIG. 25A, the mouths of the liquid supply ports 3 have a length of about 9,000 µm and a width of about 1,000 µm. With reference to FIG. 25B, the two outermost light-transmissive sections Mo have a length of about 9,000 µm and a width of about 500 µm. The longitudinal center line C0 of the center liquid supply port 3 is aligned with that of the light-transmissive section Mo corresponding to the center liquid supply port 3. If four or more liquid supply ports 3 are used, the longitudinal center lines of the inner liquid supply ports 3 placed between the two outmost liquid supply ports 3 are each aligned with the corresponding longitudinal center lines of the light-transmissive sections Mo that correspond to the inner liquid supply ports 3. The three liquid supply ports 3 are described below. As shown in FIG. 25B, the longitudinal center lines C1 of the two outermost liquid supply ports 3 are aligned with those of the light-transmissive sections Mo corresponding to the outermost liquid supply ports 3. The center light-transmissive section Mo has a length of about 9,000 µm and a width of about 1,000 µm. Since the size and arrangement of the light-transmissive sections Mo are selected depending on the shape of the spaces in the liquid supply ports 3 as described above, ultraviolet light P reflected by the small trapezoidal walls S1 and the large trapezoidal walls S2 can be prevented from being applied to zones outside the adhesive layers 12a lying over the liquid supply ports 3, the zones being located close to the dicing streets 1b, the adhesive layers 12a being irradiated with ultraviolet light P. That is, the increase in pattern size can be suppressed.

FIG. 25C shows another type of light-shielding mask M having three light-transmissive sections Mo, corresponding to the liquid supply ports 3, for preventing the increase in pattern size from occurring. That is, the light-transmissive sections Mo are useful in preventing regions of the adhesive 12 that correspond to areas between the liquid supply ports 3 from being cured. The center light-transmissive section Mo has a length of about 9,000 µm and a width of about 600 µm; that is, the right side and left side of the center light-transmissive section Mo are each located 200 nm closer to the longitudinal center of the center light-transmissive section Mo than those of former one described above. The outside light-transmissive sections Mo have a length of about 9,000 µm and a width of about 300 µm; that is, the width of these center light-transmissive sections Mo is about 200 nm smaller than that of former ones described above. This configuration is effective in preventing the increase in pattern size from occurring. Therefore, the adhesive layers 12a corresponding to the liquid supply ports 3 can be prevented from being connected to regions of the adhesive 12 that correspond to zones between the liquid supply ports 3. Furthermore, regions of the adhesive 12 that correspond to zones between the liquid supply ports 3 and the dicing streets 1b adjacent to the liquid supply ports 3 can be prevented from being cured; hence, the adhesive layers 12a are prevented from being connected to the adhesive layers 12b.

According to this embodiment, the adhesive layers 12a lying over the liquid supply ports 3 can be prevented from being connected to the adhesive layers 12b lying over the dicing streets 1b; hence, the advantages described above can be securely achieved.

For the configurations described in the first to fourth embodiments with reference to the accompanying drawings, if a light-shielding mask need not be aligned with a wafer with high accuracy, the size of light-transmissive sections of the light-shielding mask may be increased to be greater than that of the mouths of liquid supply ports. If the increase in pattern size must be suppressed, the size of light-transmissive sections of the light-shielding mask may be decreased to be less than that of the mouths of liquid supply ports. Accordingly, the desired advantages described above can be achieved by varying configurations depending on actual conditions.

EXAMPLES

Samples 1 to 6 were prepared, wherein Sample 1 is a comparative example and Samples 2 to 6 are examples of the present invention. Each sample included a wafer and 204 element sections arranged thereon, the element sections being processed into element substrates for liquid-discharging heads. The element sections each had corresponding liquid supply ports and orifices. The sample was diced and then cleaned. The sample was investigated if there were any adhesive particles on the wafer and if chipping occurred. In particular, the number of the following particles was counted: adhesive particles which were bonded to the walls of the orifices and regions around the orifices and which had a particle size of 1 µm or less. Table 1 shows results of the investigation.

TABLE 1

| Samples | Irradiation Dose | Transmittance of Mask Sections Mb | Transmittance of Mask Sections Ma | Percentage of Area Covered with Particles | Chipping |
|---|---|---|---|---|---|
| 1 | Not Irradiated | 100% | 100% | 100 | 0/204 |
| 2 | 400 mJ/cm² | 100% | 100% | 34 | 0/204 |
| 3 | 1200 mJ/cm² | 100% | 0% | 14 | 0/204 |
| 4 | 1200 mJ/cm² | 100% | 100% | 7 | 9/204 |
| 5 | 1200 mJ/cm² | 100% | 35% | 8 | 0/204 |
| 6 | 1200 mJ/cm² | 100% | 0% | 13 | 4/204 |

In Table 1, the term "transmittance of mask sections Ma" means the transmittance of first light-transmissive sections Ma through which ultraviolet light passes and which correspond to liquid supply ports. The term "transmittance of mask sections Mb" means the transmittance of second light-transmissive sections Mb through which ultraviolet light passes and which correspond to dicing streets extending along cutting lines. The term "percentage of area covered with particles" means the percentage of the area of each sample covered with the adhesive particles, the percentage being expressed on the basis that the percentage of the area of Sample 1, having a dicing tape 10 which was not subjected to curing, covered with particles is 100. The percentage of the area of each sample covered with the adhesive particles should be small.

The term "chipping" means the following problem: the dicing tape, affixed to the rear face of the wafer, for retaining the wafer is reduced in adhesive strength, whereby chips obtained by dicing the wafer are damaged during dicing. In Table 1, chipping is represented by the ratio of damaged chips to total chips. The number of damaged chips should be small.

Table 1 shows that the adhesive particles can be greatly reduced in number by applying ultraviolet light to adhesive layers 12b corresponds to the dicing streets with a dose of 1,200 mJ/cm² or more, as is clear from the data of Samples 3 to 6. The adhesive particles can be reduced in number by curing adhesive layers 12a lying over the liquid supply ports, as is clear from the data of Samples 4 and 5. For Sample 5, chipping can be prevented from occurring during dicing because the dose of ultraviolet light applied to the adhesive layers 12a is equal to 35% of that applied the adhesive layers 12b. This shows that Sample 5, which is the example of the present invention, is superior.

For Sample 4, the dose of ultraviolet light applied to the adhesive layers 12a is equal to that applied the adhesive layers 12b; hence, the adhesive layers 12a of Sample 4 are more greatly cured as compared to those of Sample 5. Therefore, chippings occurred when Sample 4 was subjected to dicing.

Table 2 shows the relationship between the dose of ultraviolet light and the tackiness and elastic modulus of an adhesive, the elastic modulus being determined by converting obtained measurements into index values by normalizing the elastic modulus of a sample not irradiated with ultraviolet light to 1.

TABLE 2

| Irradiation Dose | Tackiness | Elastic Modulus (*) |
|---|---|---|
| Not Irradiated | Tacky | 1.0 |
| 400 mJ/cm² | Tack-free | 3.6 |
| 1200 mJ/cm² | Tack-free | 4.3 |

(*) The elastic modulus was measured with a microhardness meter.

Table 2 shows that a dose of 400 mJ/cm² is sufficient to cause the adhesive to lose its adhesive strength and the sample irradiated with ultraviolet light with a dose of 400 mJ/cm² has an elastic modulus less than that of the sample irradiated with ultraviolet light with a dose of 1,200 mJ/cm². Therefore, the adhesive of the former sample has been probably cured insufficiently.

Samples 4 and 5 are not significantly different in particle creation from each other. This shows that the adhesive layers 12a may be cured such that they become tack-free.

The increase in pattern size described above probably causes chipping to occur in samples irradiated with ultraviolet light. This shows that a method according to an embodiment of the present invention is effective in preventing adhesive particles from being created.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application Nos. 2004-132415 filed Apr. 28, 2004; 2004-135193 filed Apr. 30, 2004; 2004-353694 filed Dec. 7, 2004; 2004-353693 filed Dec. 7, 2004; and 2005-117693 filed Apr. 15, 2005, which are hereby incorporated by reference herein.

What is claimed is:

1. A method for dicing a wafer having a first face, dicing streets, and openings defined in the first face, along the dicing streets, the method comprising the steps of:

affixing a dicing tape having first adhesive regions and second adhesive regions to the first face such that the dicing tape lies over the openings, the first adhesive regions are exposed in the openings, and the second adhesive regions correspond to the dicing streets; and after the affixing step, treating the dicing tape to reduce adhesive strengths of the first and second adhesive regions such that the adhesive strength of the second adhesive regions is less than the adhesive strength of the first adhesive regions.

2. The method according to claim 1, wherein the dicing tape includes a photocurable adhesive, the method further comprising:

aligning a light-shielding mask having light-transmissive sections relative to the dicing tape and the wafer; and the treating step including irradiating the photocurable adhesive with light via the light-transmissive sections to partly reduce the adhesive strength of the photocurable adhesive.

3. The method according to claim 2, wherein the second adhesive regions have a width greater than that of cut zones of the dicing streets.

4. The method according to claim 2, wherein the aligning step includes aligning the light-shielding mask so that long sides of the light-transmissive sections that extend along the dicing streets are located closer to the openings than the dicing streets.

5. The method according to claim 2, wherein the openings include at least three openings arranged in parallel, and wherein the aligning step includes providing outermost light-transmissive sections having an area less than that of the center light-transmissive section or the inner light-transmissive sections, and aligning the light-transmissive sections to correspond to the openings.

* * * * *